(12) United States Patent
Bryant et al.

(10) Patent No.: US 7,288,445 B2
(45) Date of Patent: Oct. 30, 2007

(54) DOUBLE GATED TRANSISTOR AND METHOD OF FABRICATION

(75) Inventors: Andres Bryant, Essex Junction, VT (US); Meikei Ieong, Wappingers Falls, NY (US); K. Paul Muller, Wappingers Falls, NY (US); Edward J. Nowak, Essex Junction, VT (US); David M. Fried, Williston, VT (US); Jed Rankin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/125,063

(22) Filed: May 9, 2005

(65) Prior Publication Data

US 2005/0221543 A1 Oct. 6, 2005

Related U.S. Application Data

(62) Division of application No. 09/886,823, filed on Jun. 21, 2001, now Pat. No. 6,960,806.

(51) Int. Cl.
*H01L 21/84* (2006.01)
(52) U.S. Cl. .............. 438/157; 438/149; 438/291; 438/585; 257/330; 257/331; 257/332
(58) Field of Classification Search .......... 438/149, 438/157, 283, 286, 585; 257/229, 230, 231, 257/232
See application file for complete search history.

(56) References Cited

U.S. PATENT DOCUMENTS 3,872,491 A 3/1975 Hanson et al.
5,563,093 A 10/1996 Koda et al.
5,576,227 A * 11/1996 Hsu .................... 438/291

(Continued)

FOREIGN PATENT DOCUMENTS

EP 0 694 977 A2 1/1996

OTHER PUBLICATIONS

Tanaka, et al.; "Ultrafast Low-Power Operation of p+-n+ Double-Gate SOI MOSFETs"; 1994 Symposium on VLSI Technology Digest of Technical Papers; pp. 11-12.

(Continued)

*Primary Examiner*—Matthew Smith
*Assistant Examiner*—Su C. Kim
(74) *Attorney, Agent, or Firm*—Schmeiser, Olsen & Watts; Richard M. Kotulak

(57) ABSTRACT

Accordingly, the present invention provides a double gated transistor and a method for forming the same that results in improved device performance and density. The preferred embodiment of the present invention uses provides a double gated transistor with asymmetric gate doping, where one of the double gates is doped degenerately n-type and the other degenerately p-type. By doping on of the gates n-type, and the other p-type, the threshold voltage of the resulting device is improved. In particular, by asymmetrically doping the two gates, the resulting transistor can, with adequate doping of the body, have a threshold voltage in a range that enables low-voltage CMOS operation. For example, a transistor can be created that has a threshold voltage between 0V and 0.5V for nFETs and between 0 and −0.5V for pFETs.

3 Claims, 25 Drawing Sheets

U.S. PATENT DOCUMENTS

| | | | |
|---|---|---|---|
| 5,670,397 A | 9/1997 | Chang et al. | |
| 5,780,330 A | 7/1998 | Choi | |
| 5,793,082 A | 8/1998 | Bryant | |
| 5,877,535 A | 3/1999 | Matsumoto | |
| 5,882,964 A | 3/1999 | Schwalke | |
| 5,899,710 A | 5/1999 | Mukai | |
| 5,902,121 A | 5/1999 | Goto | |
| 5,933,721 A | 8/1999 | Hause et al. | |
| 5,939,937 A | 8/1999 | Terletzki | |
| 6,015,991 A | 1/2000 | Wheeler et al. | |
| 6,197,672 B1 | 3/2001 | Lin et al. | |
| 6,265,293 B1* | 7/2001 | Yu | 438/528 |
| 6,362,057 B1* | 3/2002 | Taylor et al. | 438/286 |
| 6,586,296 B1* | 7/2003 | Watt | 438/224 |

OTHER PUBLICATIONS

Tang, et al.; "Comparison of Short-Channel Effect and Offstate Leakage in Symmetric vs. Asymmetric Double Gate MOSFETs"; 2000 IEEE International SOI Conference; Oct. 2000; p. 120.

Huang, et al.; "Sub 50-nm FinFET: PMOS"; 0-7803-5413-3/99; Department of Electrical Engineering and Computer Sciences, University of California.

Kim K et al.; "Double-Gate CMOS: Symmetrical-Versus Asymmetrical-Gate Devices"; IEEE Transactions on Electron Devices, IEEE Inc. New York, US; vol. 48, No. 2, Feb. 2001; pp. 294-299; XP001038978; ISSN: 0018-9383/01.

* cited by examiner

US 7,288,445 B2

DOUBLE GATED TRANSISTOR AND METHOD OF FABRICATION

This application is a divisional of Ser. No. 09/886,823; filed on Jun. 21, 2001 now U.S. Pat. No. 6,960,806.

BACKGROUND OF THE INVENTION

1. Technical Field

The present invention relates generally to the field of semiconductor manufacturing and, more specifically, to a method for forming double gated field effect transistors.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever increasing device densities is particularly strong in CMOS technologies, such as the in the design and fabrication of field effect transistors (FETs). FETs are used in almost all types of integrated circuit design (i.e., microprocessors, memory, etc.) Unfortunately, increased device density in CMOS FET often results in degradation of performance and/or reliability.

One type of FET that has been proposed to facilitate increased device density is a double gated field effect transistor. Double gated FETs use two gates, one on each side of the body, to facilitate scaling of CMOS dimensions while maintaining an acceptable performance. In particular, the use of the double gate increases the gate area, which allows the transistor to have better current control, without increasing the gate length of the device. As such, the double gated FET is able to have the current control of a larger transistor without requiring the device space of the larger transistor.

Unfortunately, several difficulties arise in the design and fabrication of double gated CMOS transistors. First, the relative dimensions of a double gated transistor are such that it is difficult to reliably fabricate one that has a reliable performance and minimum feature size. Second, the threshold voltage of a double gated transistor is highly dependent upon the material used for the two gates. In particular, current fabrication techniques have generally resulted in a double gated transistor that has either too high a threshold voltage, or too low of a threshold voltage. For example, if the gates are doped the same polarity as the source, the threshold voltage will generally be near zero. Conversely, if the gates are doped the opposite polarity of the source, then the threshold voltage will be approximately one volt. Neither result is desirable in most CMOS applications.

Thus, there is a need for improved device structures and methods of fabrications of double gated CMOS devices that provide improved threshold voltage of the resulting double gated CMOS without overly increasing fabrication complexity.

DISCLOSURE OF INVENTION

Accordingly, the present invention provides a double gated transistor and a method for forming the same that results in improved device performance and density. The preferred embodiment of the present invention uses provides a double gated transistor with asymmetric gate doping, where one of the double gates is doped degenerately n-type and the other degenerately p-type. By doping one of the gates n-type, and the other p-type, the threshold voltage of the resulting device is improved. In particular, by asymeterically doping the two gates, the resulting transistor can, with adequate doping of the body, have a threshold voltage in a range that enables low-voltage CMOS operation. For example, a transistor can be created that has a threshold voltage between 0V and 0.5V for nFETs and between 0 and −0.5V for pFETs.

The preferred embodiment of the present invention is implemented using a fin type double gated structure. In a fin type structure, the double gates are formed on each side of the body, with the body being disposed horizontally between the gates. The preferred method for forming this double gated transistors allows the gate length of the device to have minimum feature size, while allowing the thickness of the body to be much smaller than the gate length. This improves control of the threshold voltage of the resulting device. The preferred method for forming the double gated transistor accomplishes by using an image enhancement technique, sidewall image transfer, to define the thickness of the transistor body, allowing it to be reliably formed at sub minimum feature size.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements.

BEST MODE FOR CARRYING OUT THE INVENTION

Accordingly, the present invention provides a double gated transistor and a method for forming the same that results in improved device performance and density. The preferred embodiment of the present invention uses provides a double gated transistor with asymmetric gate doping, where one of the double gates is doped degenerately n-type and the other degenerately p-type. By doping one of the gates n-type, and the other p-type, the threshold voltage of the resulting device is improved. In particular, by asymmetrically doping the two gates, the resulting transistor can, with adequate doping of the body, have a threshold voltage in a range that enables low-voltage CMOS operation. For example, a transistor can be created that has a threshold voltage between 0V and 0.5V for nFETs and between 0 and −0.5V for pFETs.

The preferred embodiment of the present invention is implemented using a fin type double gated structure. In a fin type structure, the double gates are formed on each side of the body, with the body being disposed horizontally between the gates. The preferred method for forming this double gated transistors allows the gate length of the device to have minimum feature size, while allowing the thickness of the body to be much smaller than the gate length. This improves control of the threshold voltage of the resulting device. The preferred method for forming the double gated transistor accomplishes by using an image enhancement technique, sidewall image transfer, to define the thickness of the transistor body, allowing it to be reliably formed at sub minimum feature size.

Various electrically conducting materials have associated with them a built-in electrical potential, often referred to as a fermi level, which, along with externally applied voltage, determines the relative affinity of the conductor for electrons (or holes). In a metal, the fermi level is intrinsic to the material, while in a semiconductor, such as silicon, this fermi level can be adjusted to values between the valence band and conduction band by introduction of impurities which supply excess holes or electrons. In the asymmetric double gated FET of the preferred embodiment, the two gate electrodes are doped with opposite polarity, with one gate being doped n-type and the other gate being doped p-type. Thus, the two gate electrodes have different fermi levels and hence one gate electrode (the strong gate, the n-gate for nFETs) has a greater affinity for the inversion carriers while the other electrode (the weak gate, the p-gate for nFETs) has a lesser affinity for the inversion carriers. As a result the inversion channel will form in the semiconductor body at a location nearer the 1 strong 20 gate, and thus results both gate electrodes contributing to the inversion potential leading to a relatively low threshold voltage (e.g, between 0 and 0.5 volts).

Figure 1:
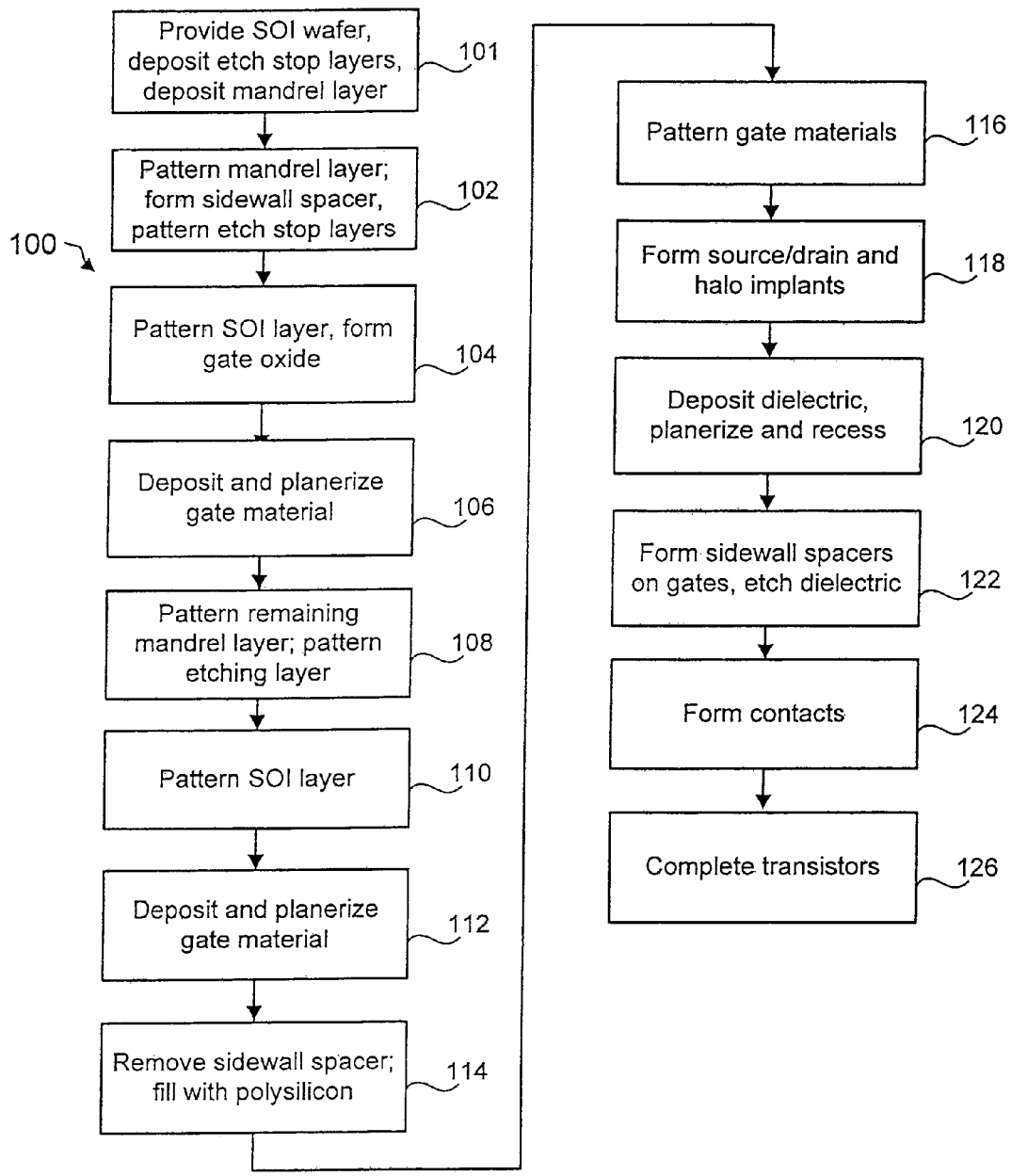
FIG. 1 is a flow diagram illustrating a first fabrication method.

Turning now to FIG. 1, a method 100 for forming a double gated transistor in accordance with the preferred embodiment is illustrated. Method 100 forms a double gated transistor in a way that improves the threshold voltage of the transistor, while maintaining fabrication reliability and simplicity.

The first step 101 of method 100 is to provide an appropriate wafer, deposit various etch stop layers, and deposit a mandrel layer. In the preferred embodiment, the wafer used comprises a silicon on insulator (SOI) wafer. As such, the wafer comprises a buried oxide layer beneath an SOI layer. As will be come clear, the SOI layer is used to form the body of the double gated transistor. As such, it is generally preferable to use a SOI layer that has a p-type (for NFETs) doping density in the range of $3 \times 10^{18}$ cm$^{-3}$ to $8 \times 10^{18}$ cm$^{-3}$ to provide proper centering and control of the threshold voltage of the transistor. However, in another embodiment to be described later, the doping of the SOI layer is done with an angled implant to facilitate the achievement of a uniform concentration density throughout the body.

However, non-SOI wafers can be used. When a non-SOI wafer is used, the processing remains otherwise identical to those of the SOI wafer case, except as noted.

With a SOI wafer provided, three etch stop layers are formed on the wafer, preferably comprising a silicon dioxide layer, a silicon nitride layer, and a second silicon oxide layer. These etch stop layers will be used throughout the fabrication process when an appropriate etch stop is needed.

Next, a mandrel layer is formed. The mandrel layer preferably comprises a layer of oxide or other suitable material. As will be explained in greater detail later, the mandrel layer is as part of a sidewall image transfer which is used to define the body of the double gated transistor. As such, the mandrel layer is used to form a sidewall spacer, which is in turn used to define the transistor body. In the preferred embodiment, the mandrel layer has a thickness of between 10 nm and 100 nm, however, such a thickness may change depending on the desired body thickness.

Figure 2:
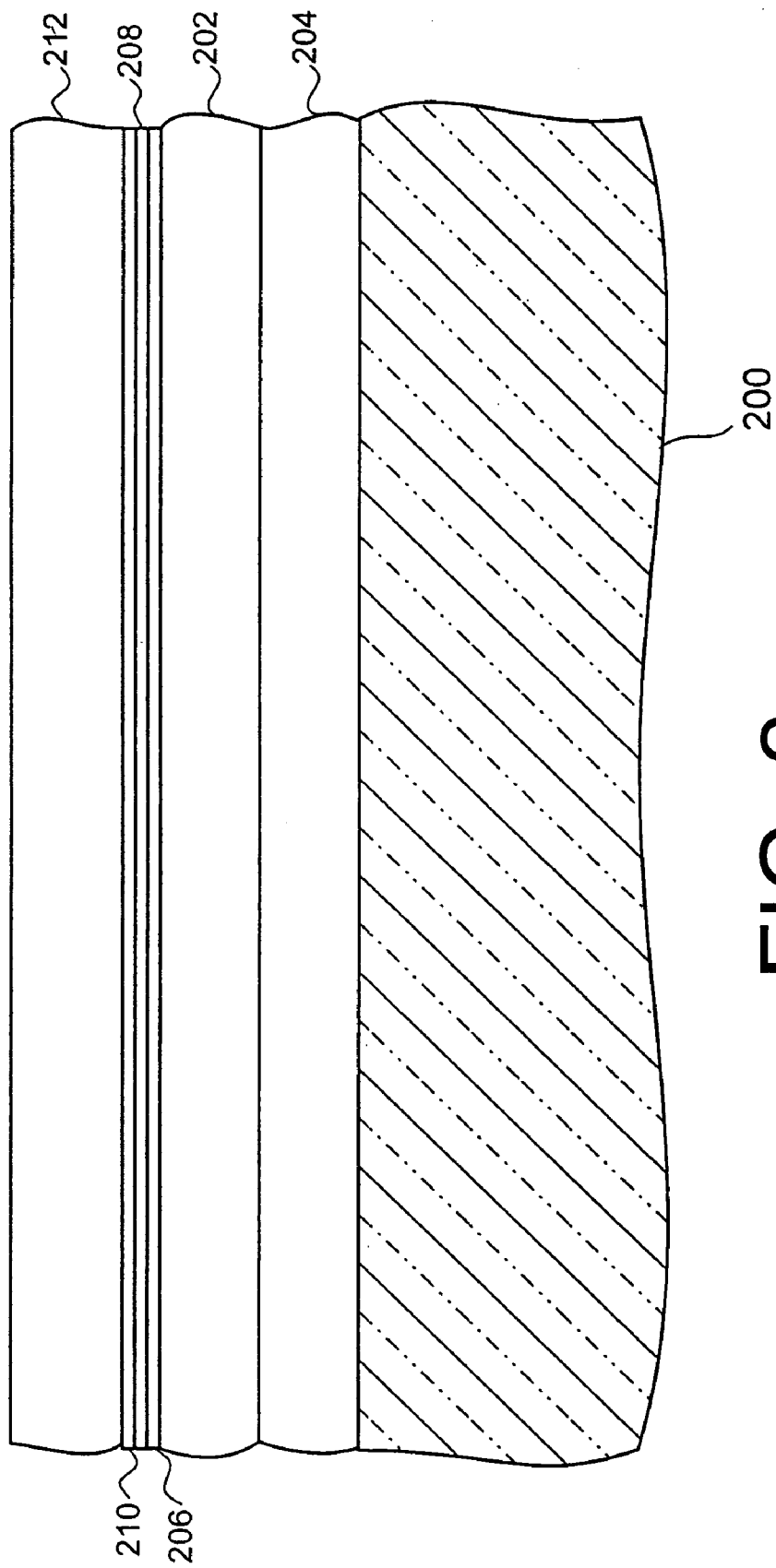
FIGS. 2-10 are cross-sectional side views of an exemplary double gated transistor during fabrication.

Turning now to FIG. 2, a wafer portion 200 is illustrated after the formation of etch stop layers and a mandrel layer. The preferred embodiment wafer portion 200 comprises an SOI wafer, and as such includes an SOI layer 202 and a buried oxide layer 204. On top of the SOI layer is formed a oxide layer 206, a nitride layer 208, and a oxide layer 210. These layers serve as etch stop layers. On top of oxide layer 210 is formed a mandrel layer 212.

Returning to FIG. 1, the next step 102 is to pattern the mandrel layer, form sidewall spacers, and pattern the etch stop layers. The mandrel layer is pattered to open that area in which the one of the double gates is formed. The sidewall spacer is preferably formed using a deposition of silicon nitride, followed by a suitable directional etch. As will be shown later, the thickness of sidewall spacer will define the body region of the double gated transistor using sidewall image transfer.

Figure 3:
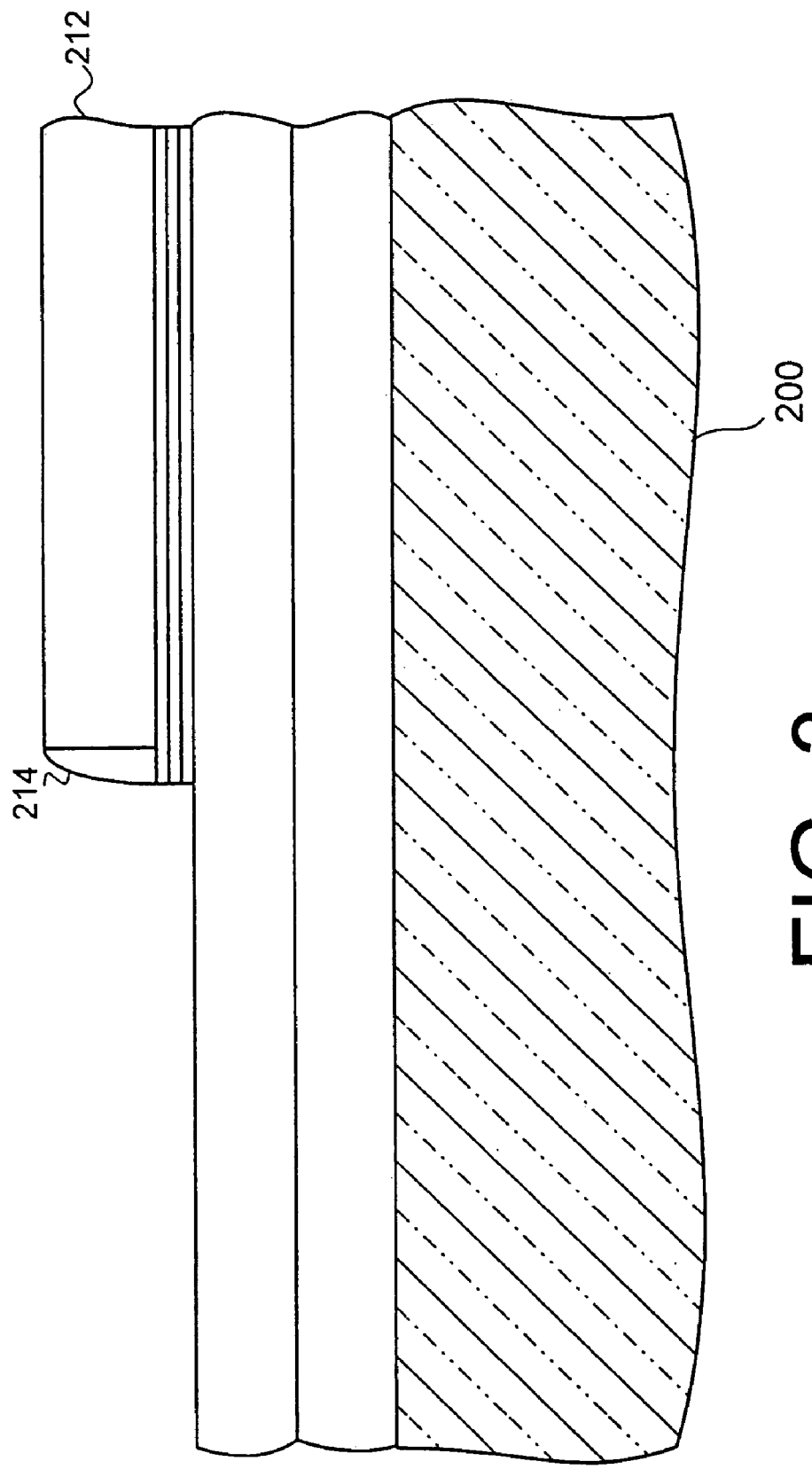

Turning to FIG. 3, the wafer portion 200 is illustrated after the mandrel layer 212 has been patterned, a sidewall spacer 214 has been formed, and the exposed portions the etch stop layer have been removed.

Returning to FIG. 1, the next step 104 is to pattern the SOI layer using the sidewall spacer and remaining mandrel material as a mask, and to form gate oxide on the exposed side of the SOI layer. This is preferably done using a suitable reactive ion etch. The gate oxide is preferably formed by thermal oxidation, typically at 750-800° C. Also, during this step an implantation into the body of the transistor can be done. This would preferably comprise an angled implant into the exposed sidewall of the SOI layer, done before the formation of the gate oxide. This would serve to properly dope the body of the transistor. As will be described in greater detail below, this angled implant can performed in a way that achieves uniform concentration density to help compensate for threshold voltage variations.

Figure 4:
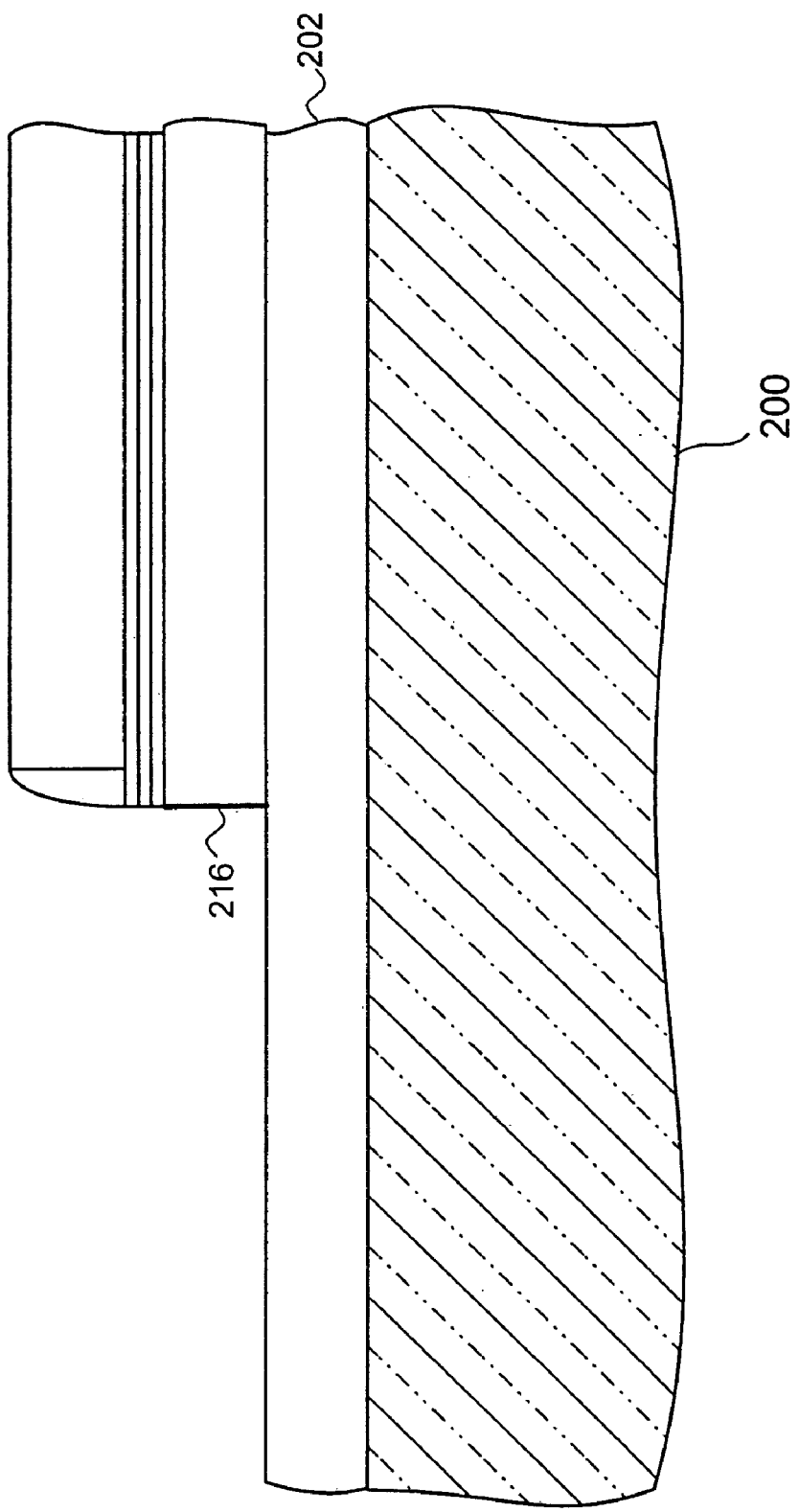

Turning now to FIG. 4, the wafer portion 200 is illustrated after the SOI layer 202 has been patterned and gate oxide 216 has been formed on the side of the SOI layer 202. Again, an angled body implant can also be performed before the formation of the gate oxide.

Figure 5:
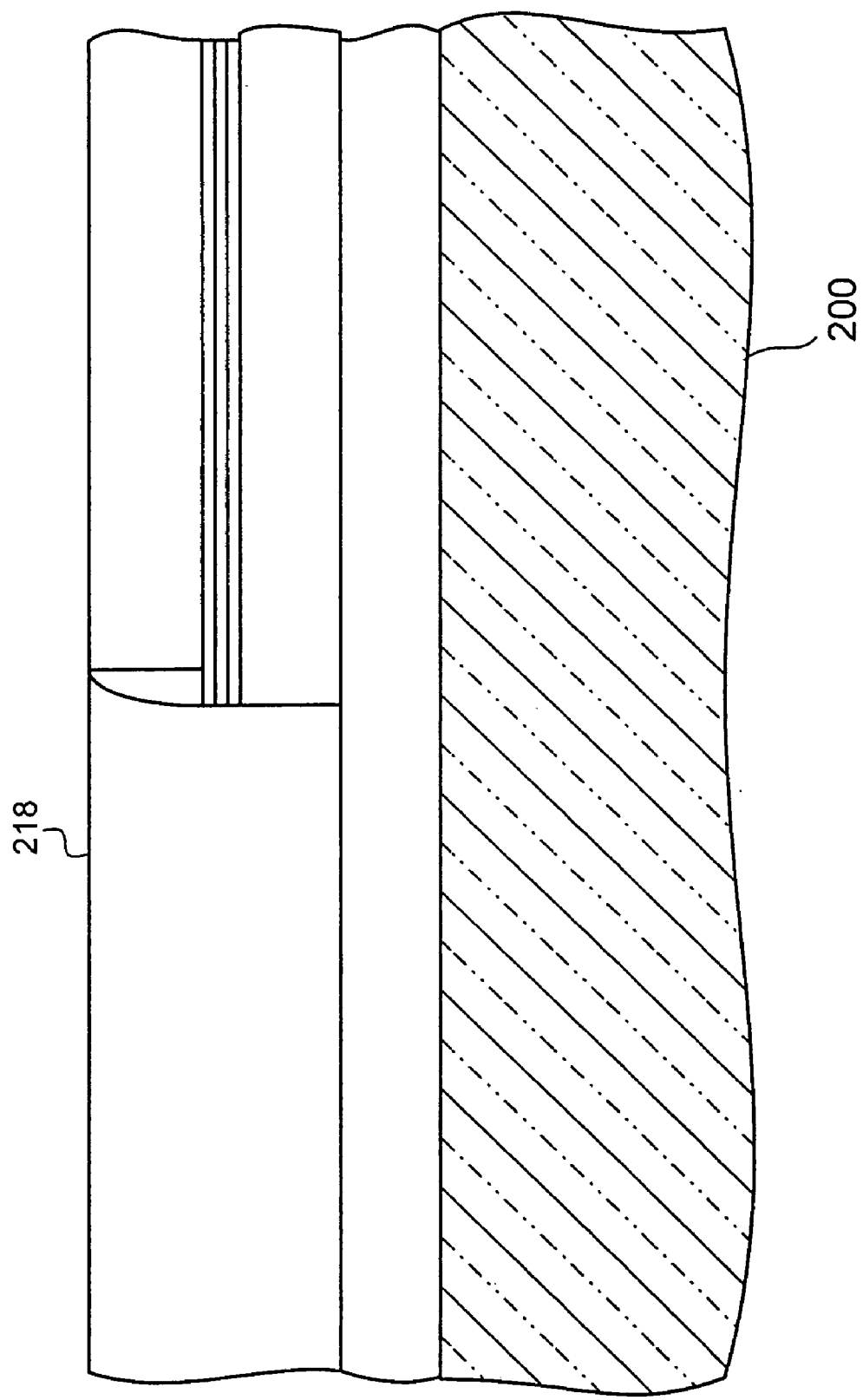

Returning to FIG. 1, the next step 106 is to deposit and planerize the gate material. As described above, in the preferred embodiment, the double gated transistor has one gate formed n+ and another gate formed p+. In the illustrated implantation, the n+ gate is formed first. Turning to FIG. 5, the wafer portion 200 is illustrated after n+ polysilicon 218 has been deposited and planarized. As will become clear, n+ polysilicon 218 will be used to form one of the gates in the preferred embodiment double gated transistor.

Figure 6:
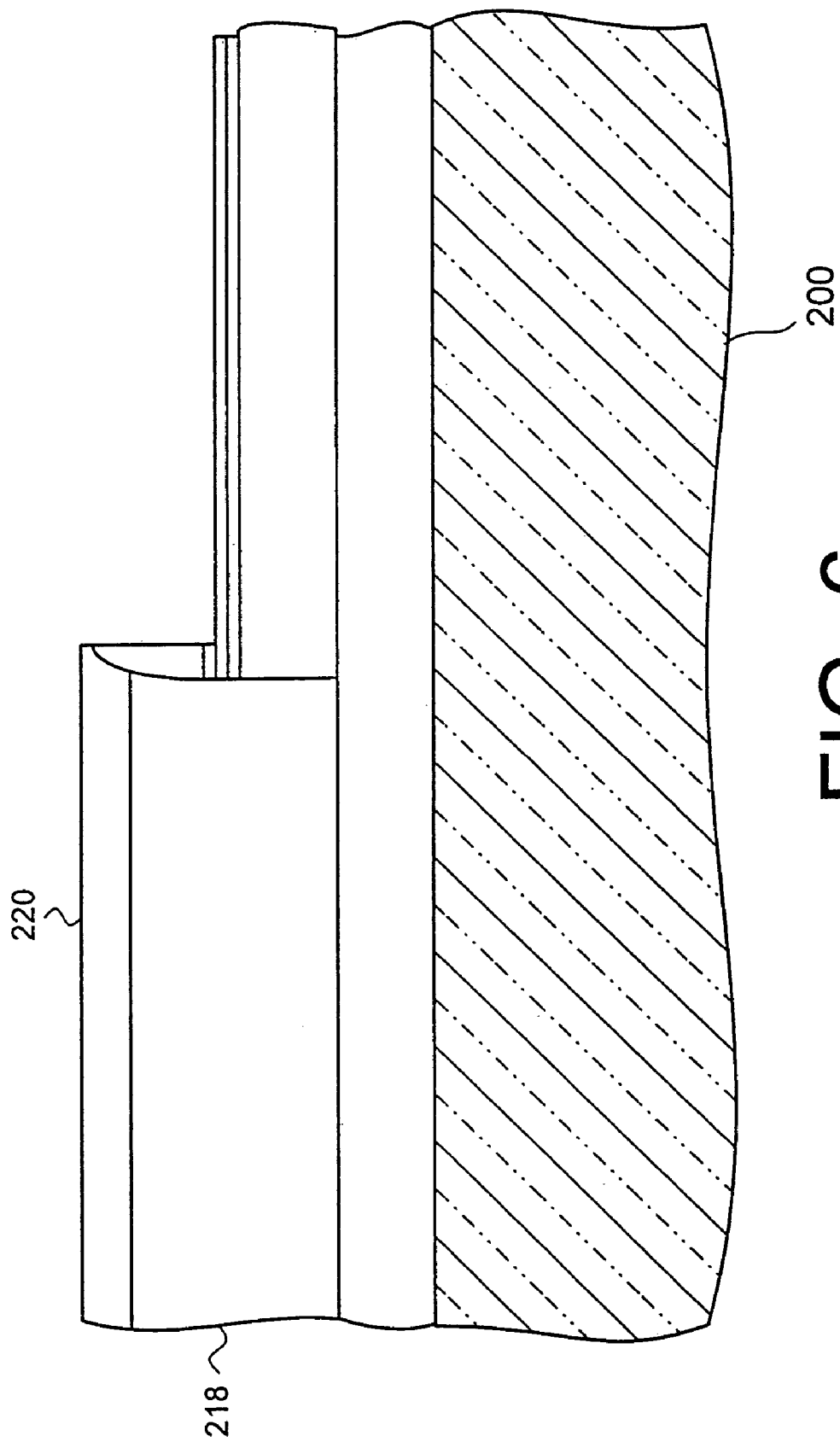

The next step 108 is to selectively remove the remaining mandrel layer. This is preferably done by performing a reactive ion etch of the mandrel selective to the nitride sidewall spacer, the nitride etch stop layer and the gate polysilicon. Then an intermediate oxide layer is formed on the polysilicon gate material, preferably by growing thermal oxide on the polysilicon gate. Turning now to FIG. 6, the wafer portion 200 is illustrated after the mandrel layer 212 has been removed, oxide etch stop layer 210 has been removed, and a thermal oxide layer 220 has been formed on the gate polysilicon 218. The nitride layer 208 that was beneath the remaining mandrel layer is etched selectively to the oxide 220 followed by a brief HF etch which removes the remaining oxide layer 206 which was beneath the remaining mandrel layer.

The next step 110 is to etch the exposed SOI layer. This is preferably done by using a reactive ion etch that etches the SOI layer, stopping on the buried oxide layer. This completes the patterning of the SOI layer to defines the thickness of the body of the double gated transistor. Then a gate oxide is formed on the exposed side of the transistor body.

Also, during this step another implantation into the body of the transistor can be performed. This would again preferably comprise an angled implant into the exposed sidewall of the SOI layer, done before the formation of the gate oxide.

Figure 7:
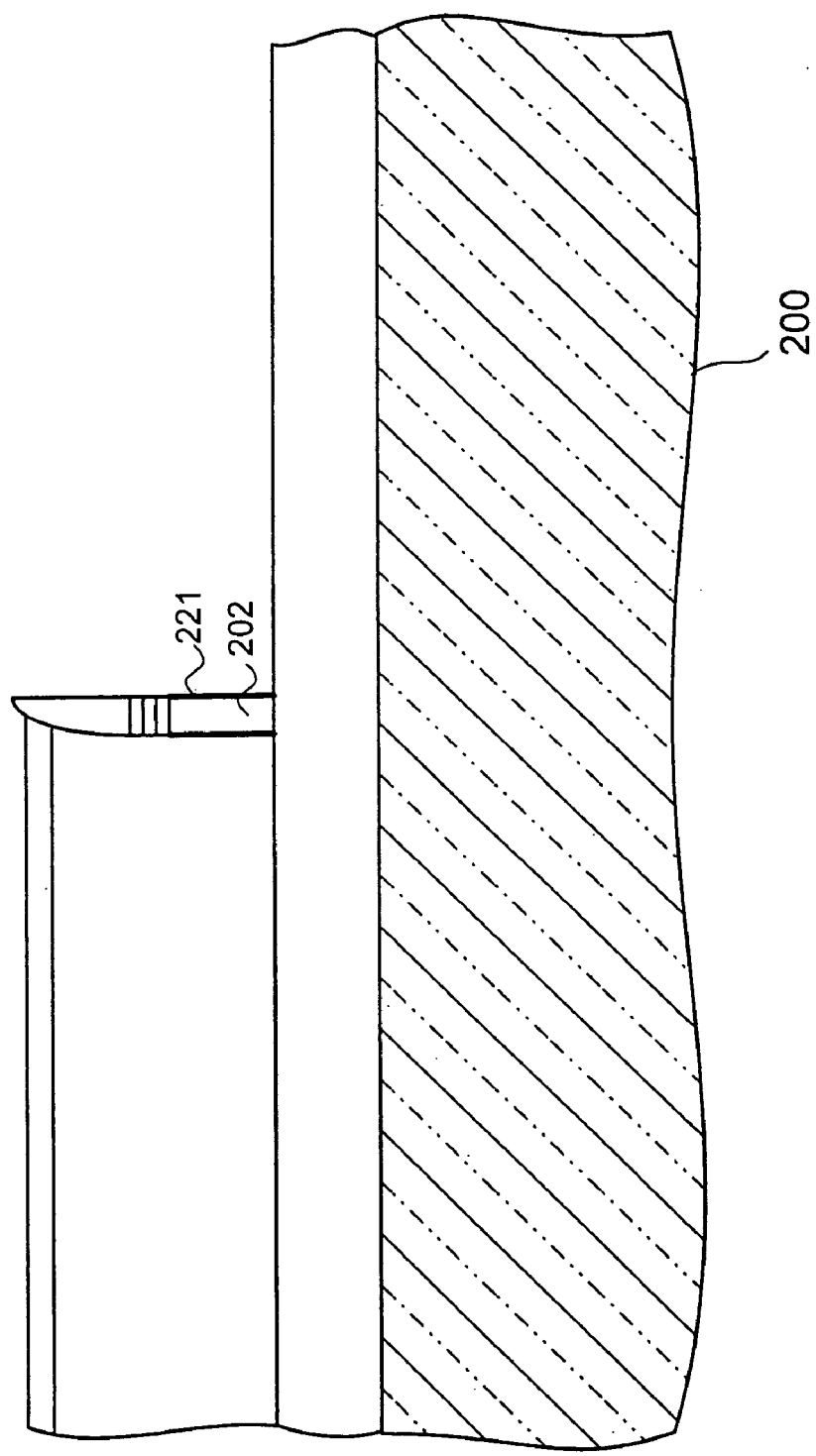

Turning to FIG. 7, the wafer portion 200 is illustrated after the patterning of the SOI layer 202. The remaining portion of SOI layer 202 comprises the body of the double gated transistor. Gate oxide 221 is formed on the exposed SOI layer 202 using a thermal oxidation or by depositing a dielectric film.

When a non-SOI wafer is used, after the silicon fins are etched by time to the desired depth (typically 100-200 nm below the original silicon surface) a deposit/etch oxide process is used to deposit silicon dioxide exclusively on the bottom horizontal surfaces of the etched silicon of thickness approximately one-quarter the height of the etched fins. The oxide may be doped with boron in the case of nFETs or phosphorus in the case of pFETs and some portion of the dopant out diffused into those portions of the fins immediately adjacent to the doped oxide. This serves to suppress leakage in what will be ungated surfaces of the fins, from source to drain.

Returning to the SOI embodiment, it should be noted that the patterning of the SOI layer has defined the body of the double gated transistor. It is generally desirable to have the body thickness, illustrated as $T_{SI}$, narrow when compared to the gate length. Typically, the body thickness should be less than one quarter of the gate length to give good threshold voltage control. Also, it is generally desirable that the body thickness should be greater than 2.5 nm to avoid degraded mobility due to quantum confinement issues. As the gate length is generally made to minimum feature size, sidewall image transfer is used to achieve the subminimum feature size of the body. Thus, as illustrated and described above, the width of the sidewall spacer determines the body thickness.

Figure 8:
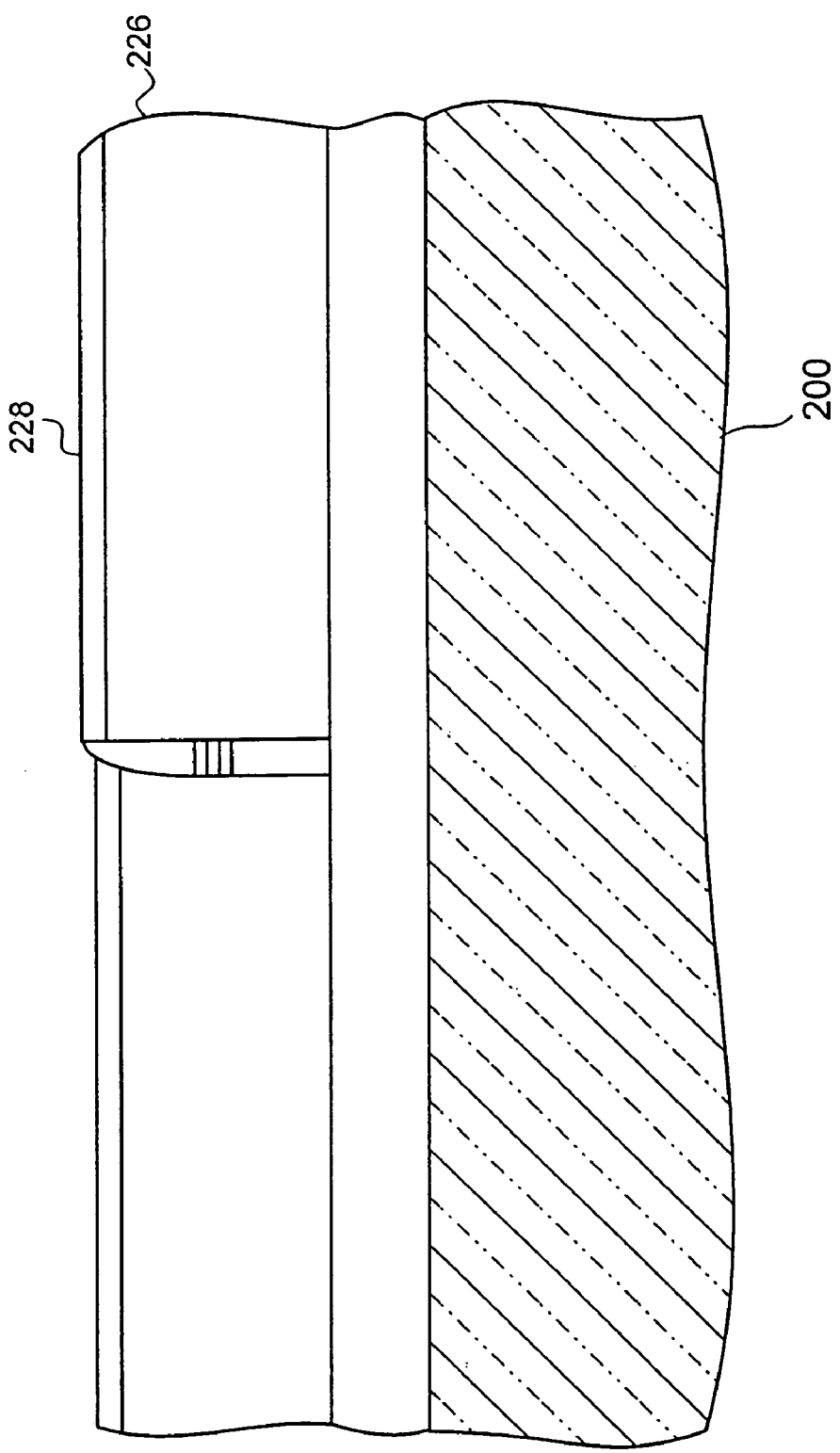

The next step 112 is to deposit and planerize the gate material for the second gate. As discussed above, the preferred embodiment uses gate material of opposite doping to form the two gates. Thus, the preferred embodiment uses p+ doped polysilicon to form the second of the two gates. The planarization of the p+ polysilicon gate material stops on the thermally grown oxide previously formed on the n+ polysilicon gate. After the planarization of the p+ polysilicon, a second layer of thermally grown oxide is formed. Turning now to FIG. 8, the wafer portion 202 is illustrated after the deposition and planarization of p+ doped polysilicon 226 to form the second gate. Thermally grown oxide 228 is then formed on the deposited polysilicon 226.

Figure 9:
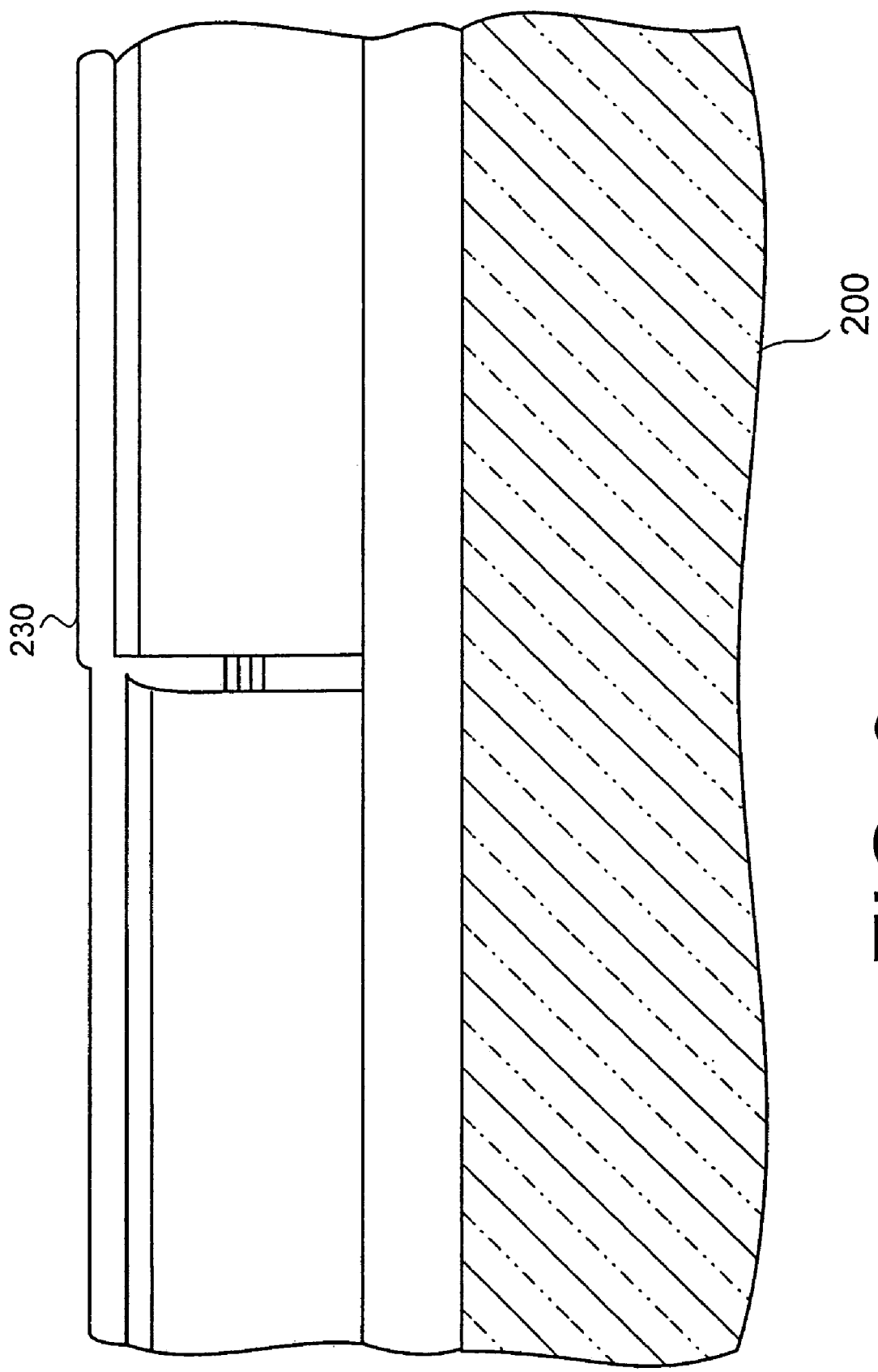
Figure 10:
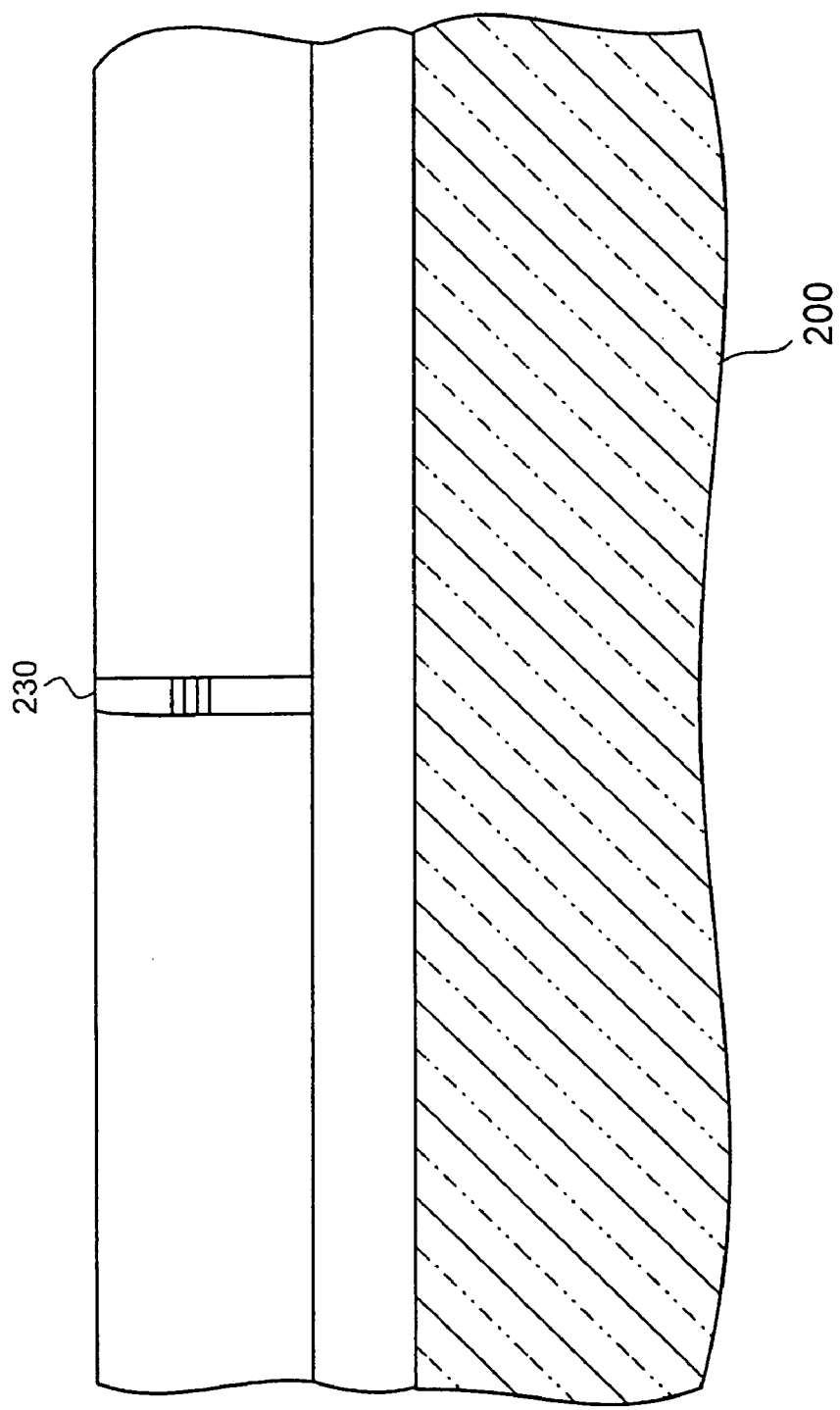

The next step 114 is to remove the sidewall spacer, and fill the sidewall spacer opening with intrinsic polysilicon, to maximize silicide formation in this region later on in the process. Optionally, the sidewall spacer may be left in place if the separate, independent gate contacts are desirable. The intrinsic polysilicon is then planarized using a CMP process that stops on the two layers of thermally grown oxide. This planarization process does not require high selectivity because there is very little excess intrinsic polysilicon to remove. The exposed thermally grown oxide on the two gates is then removed using a similar planarization process. Again, high selectivity is not required for this processing step. Turning now to FIG. 9, the wafer portion 200 is illustrated after the remaining portion of the sidewall spacer 214 has been removed, and then the space is filled with intrinsic polysilicon 230. FIG. 10 then illustrates the wafer portion 200 after the excess polysilicon 230 and thermally grown oxide 220 and 228 have been removed by CMP process. This leaves only a small portion of the intrinsic polysilicon 230 in the place of the originally formed sidewall spacer. This portion of intrinsic polysilicon 230 will be used to allow the formation of a silicide bridge connecting the p+ and n+ polysilicon gates later in the process flow.

Returning to method 100, the next step 116 is to pattern the gates. This involves selectively removing the portions of the gate materials that exist in adjacent the source and drain regions of the transistor. This is preferably done using standard lithographic techniques, i.e, depositing and patterning a hardmask, and then using the patterned hardmask as an etch block during an etching of the gate materials. The hardmask is preferably a nitride hardmask, as that is the same as the already formed etch stop layer on the body.

Figure 11:
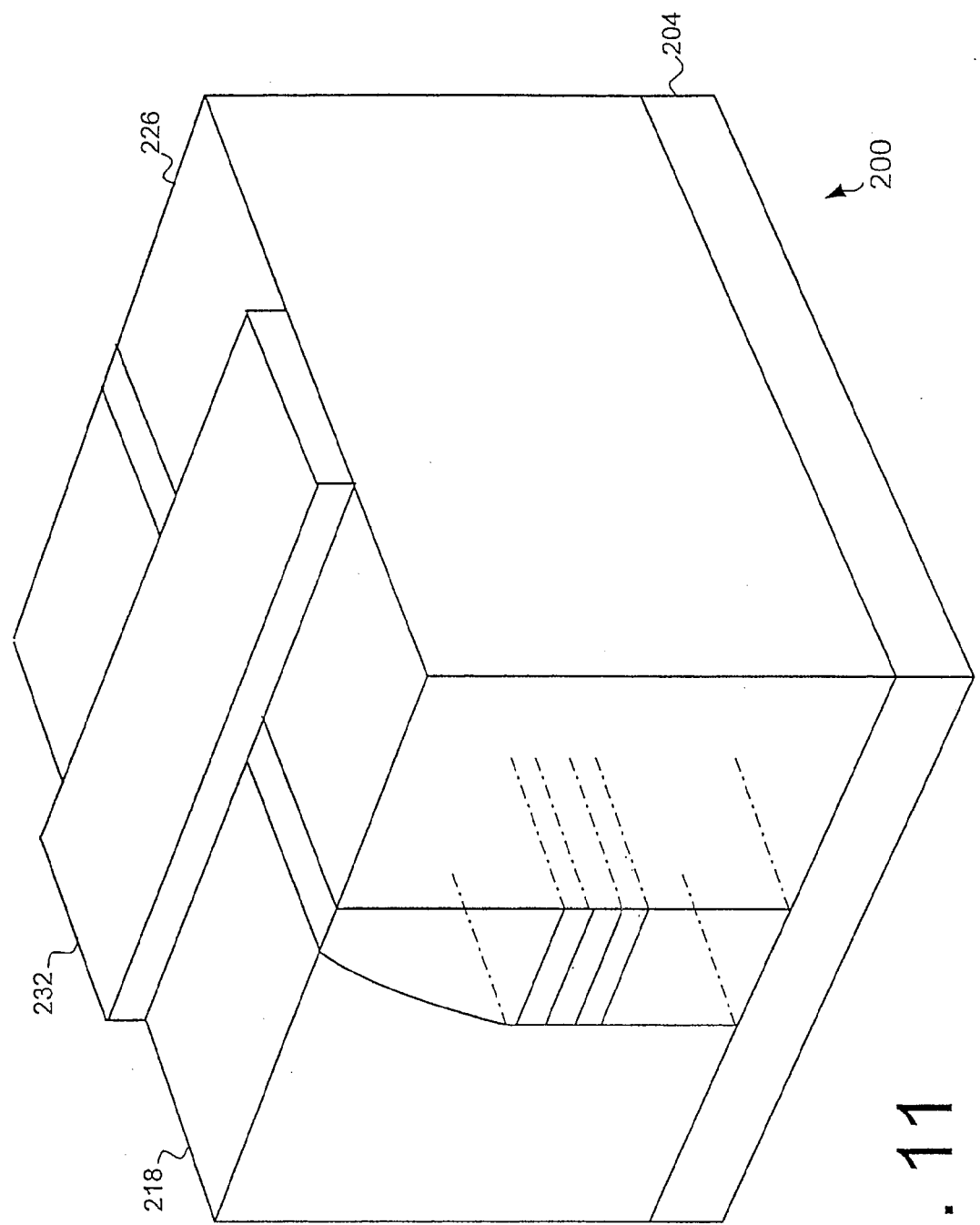
FIGS. 11-15 are perspective views of an exemplary double gated transistor during fabrication.
Figure 12:
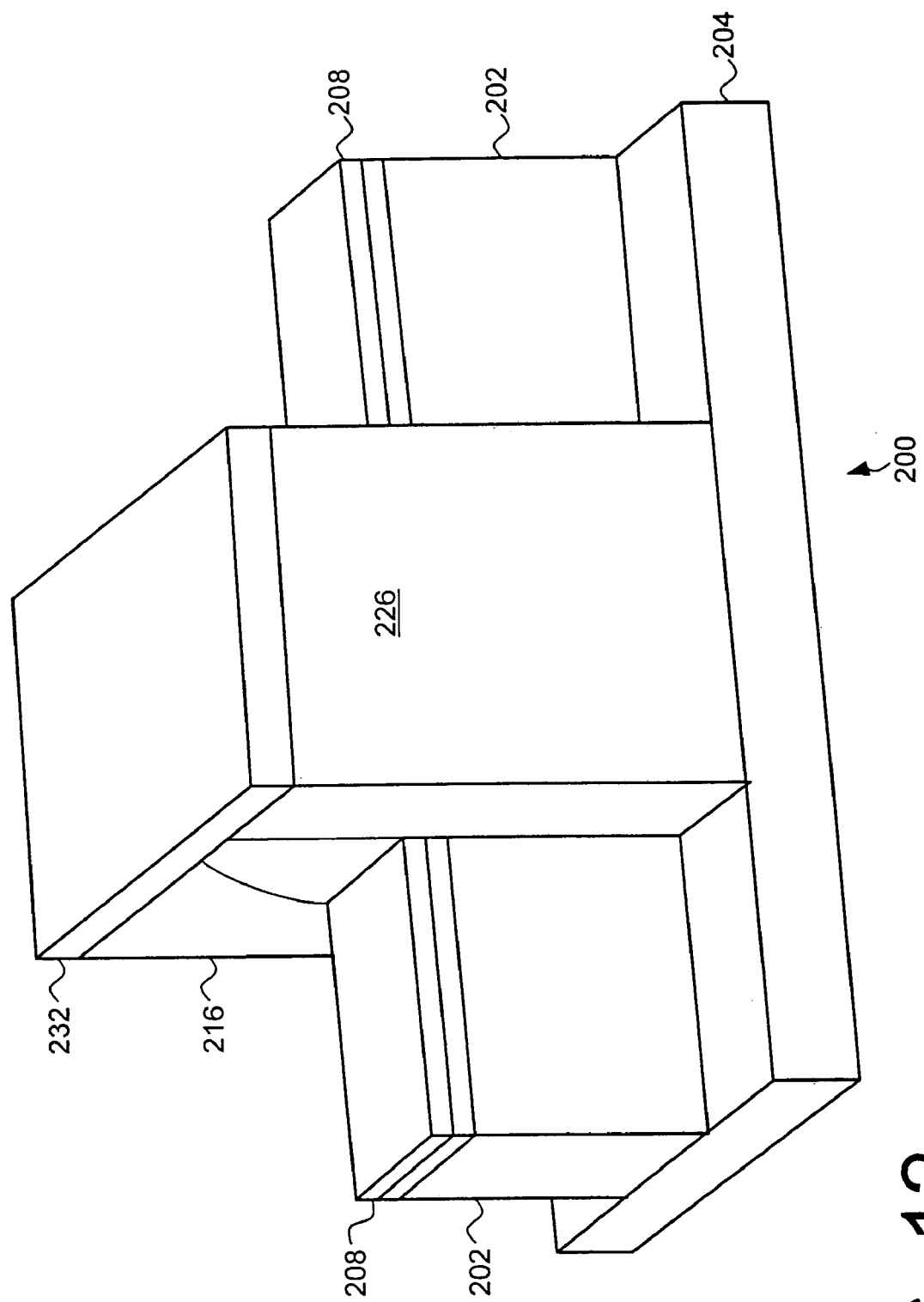

Turning now to FIG. 11, the wafer portion 200 is illustrated in perspective form. A nitride hardmask 232 has been formed extending across the two gates, which comprise n+ gate polysilicon 218 and p+ gate polysilicon 226. Turning now to FIG. 12, the wafer portion 200 is illustrated after gate polysilicon 218 and gate polysilicon 226 have been patterned using an etch selective to the hardmask. The patterning preferably removes all the gate polysilicon down to the buried oxide layer 204. The patterning of the gates is preferably done using a directional etch that is selective to nitride. Thus, the patterning does not remove the portions of the SOI body 202 that are protected by the previously formed nitride etch stop layer 208. The patterning leaves a portion of n+ polysilicon 218 and p+ polysilicon 226, which defines the two gates of the double gated transistor.

In the preferred embodiment a buffered HF clean up is performed, followed by a thermal reoxidation designed to grow oxide on all the exposed silicon surfaces. This preferably forms a thin 50 angstrom film of oxide that provides good interface when the gate meets the body.

The next step 118 in method 100 is to form source, drain, and halo implants in the transistor. Preferably these implants are made into all four directions of the body, to ensure that a uniform implant is made into both sides of the body. In particular, both the source and drain implants are made from both sides of the source and drain portion of the body. Then another implant is made, with a different implant energies and angles, to form the halo implants that improve short channel effects. The halo implants are performed at higher energies and at angles more acute with respect to the fin in order to assure placement of the halo dopant further under the gate electrodes than the source/drain dopants. For nFETs, typically arsenic is used for the source/drain implants in the range of 1 to 5 keV and a dose of $5 \times 10^{14}$ to $2 \times 10^{15}$ cm$^{-3}$ with angles between 75° and 80° with respect to the fins, and boron is used for the halo implants with energies in the range of 5 to 15 keV and a dose of $1 \times 10^{13}$ to $8 \times 10^{13}$ cm$^{-3}$ with the halo oriented between 20° and 30° with respect to the fins. Similarly, for pFETs, typically boron is used for the source/drain implants in the range of 0.5 to 3 keV and dose of $5 \times 10^{14}$ to $2 \times 10^{15}$ cm$^{-3}$ with angles between 75° and 80° with respect to the fins, and arsenic used for the halos, with energies from 20 to 45 keV and dose of $1 \times 10^{13}$ to $8 \times 10^{13}$ cm$^{-3}$ with the halo oriented between 20° and 30° with respect to the fins. Furthermore, all of the above implants must be suitable angles from the azimuth of the wafer, typically between 7° to 30° from azimuth.

Figure 13:
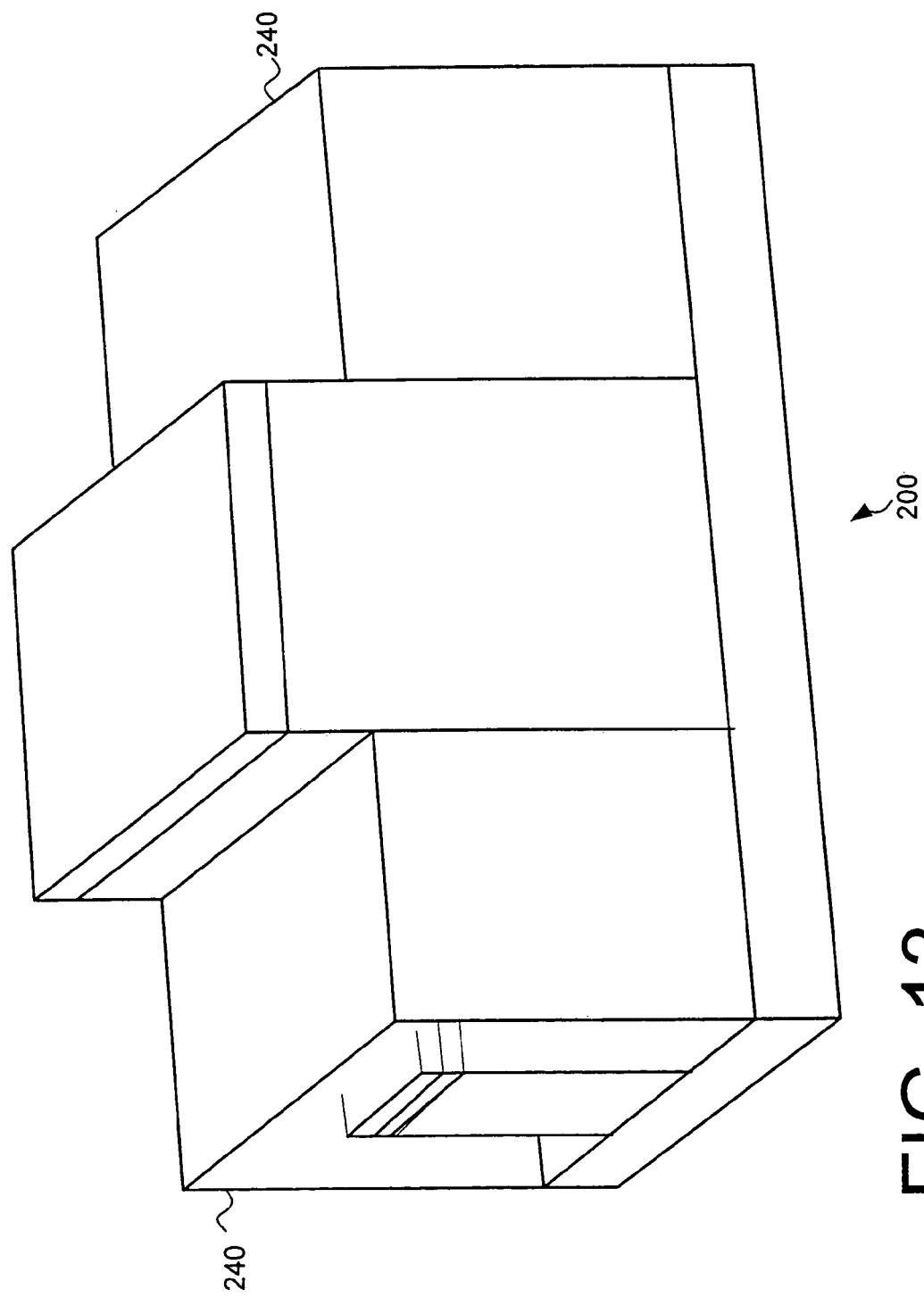

The next step 120 is to deposit dielectric of thickness greater than the height of the combined gate electrode and hardmask above the BOX, covering the entire gate electrodes and exposed fins, planerize and partially recess until a portion (typically 10 to 50 nm) of the hardmask and gate electrode, but not any of the source/drain fin region, is exposed. As will become clear, this step is part of the formation of sidewall spacers at the edges of the transistor gate. The dielectric used preferably comprises oxide, which can be etched selective to the nitride hardmask already formed. Turning now to FIG. 13, the wafer portion 200 is illustrated after dielectric 240 has been deposited, surrounding the transistor gate electrode, planarized and then recessed. The dielectric is preferably recessed using a directional etch selective to the previously provided nitride hardmask 232.

The next step 122 is to form sidewall spacers on the edges of the gates, and etch the previously deposited dielectric. This is preferably done using a conformal deposition of a dielectric material, followed by a directional etch. The sidewall spacers are preferably formed of nitride. The nitride sidewall spacers, together with the nitride hardmask, can then be used to mask a directional etch and thereby remove the oxide except adjacent to the gates.

Figure 14:
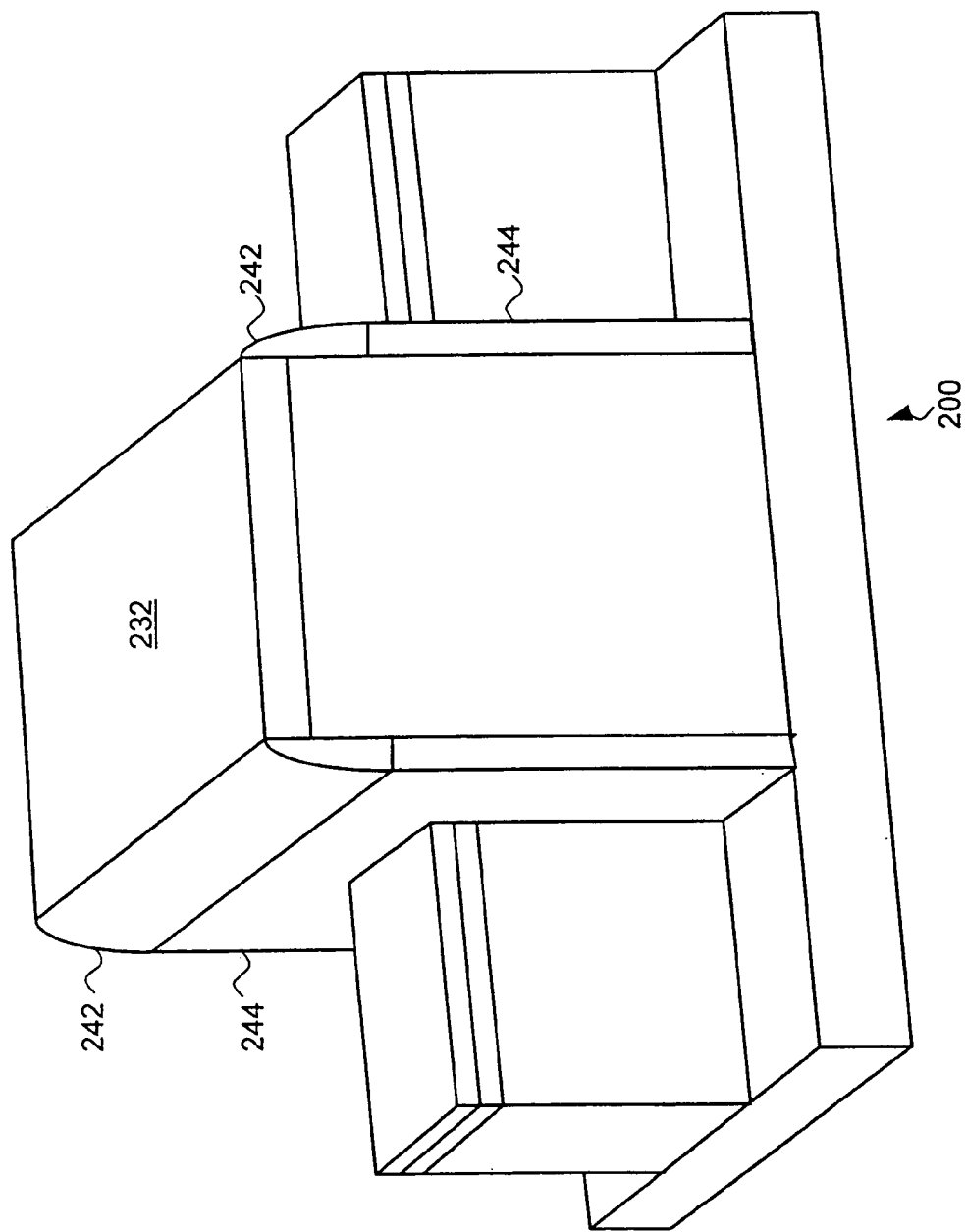

Turning now to FIG. 14, the wafer portion 200 is illustrated after nitride sidewall spacers 242 have been formed, and the dielectric 240 etched away, leaving only sidewall portions 244 adjacent the transistor gates. The hardmask 232, the sidewall spacers 242, and the sidewall portions 244 combine to effectively isolate the gate from the source and drain contacts, which are formed next.

Figure 15:
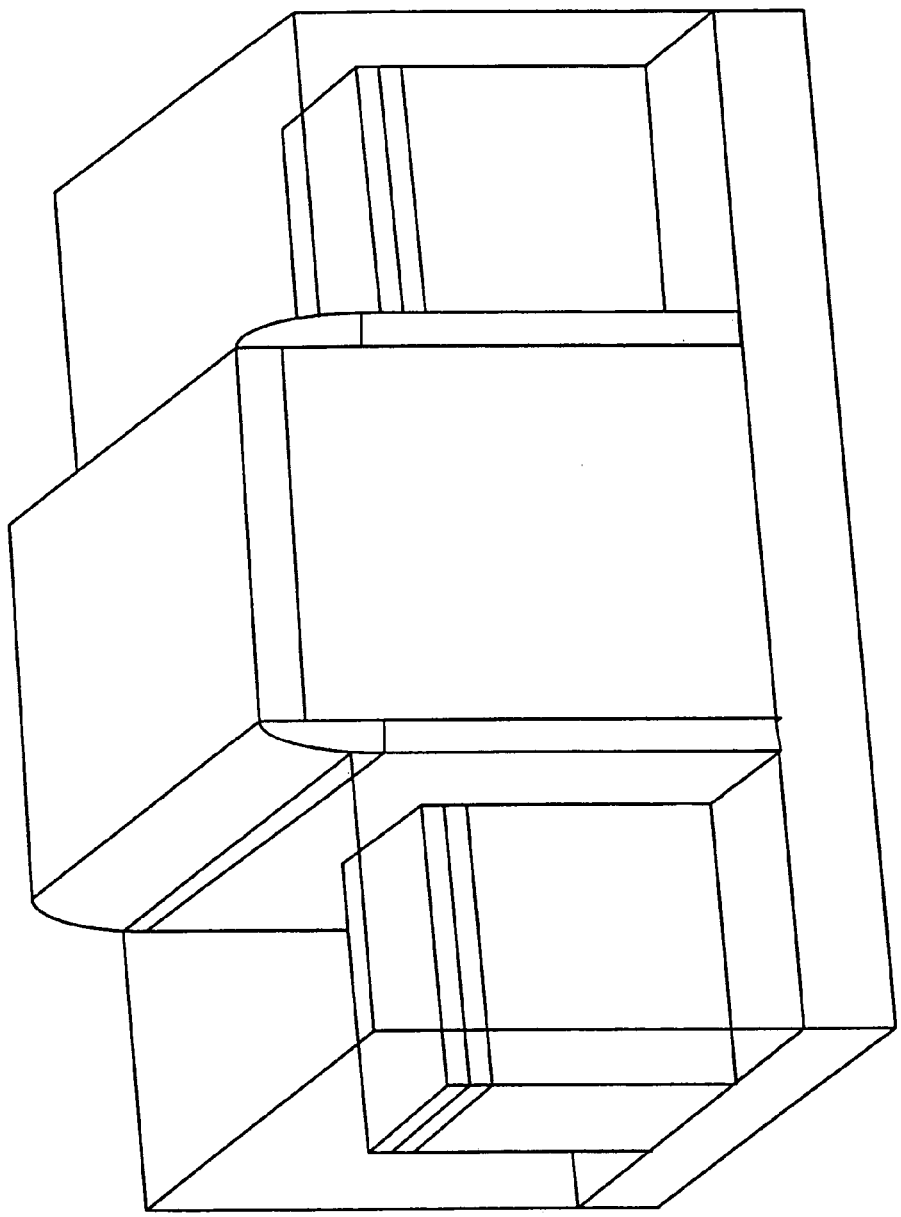

The next step 124 is to form source and drain contacts. This is preferably done by filling the previously removed areas with contact material. The contact material can be a selective deposition of silicon, tungsten or other conductive material which makes low-resistance contacts to n+ and/or p+ silicon. If silicon is used, it is doped degenerately n+ or p+ for nFETs or pFETs, respectively. The material can be deposited until it covers the wafer to a height above the height of the nitride hardmask and then planarized by RIE and/or chemical-mechanical polish until the nitride hardmask is completely exposed. Next, as illustrated in FIG. 15, the wafer is patterned with a mask which is used to etch unwanted portions of the source/drain contact material to both isolate source from drain and to isolate a plurality of such FETs from each other. Finally, the hardmask may be selectively removed by RIE or other etching techniques such as hot phosphoric acid, and a metal such as cobalt or titanium deposited and sintered at approximately 700° C. to form metal silicide over the gate, and in the case of silicon contacts, over the source and drain contacts as well.

Figure 16:
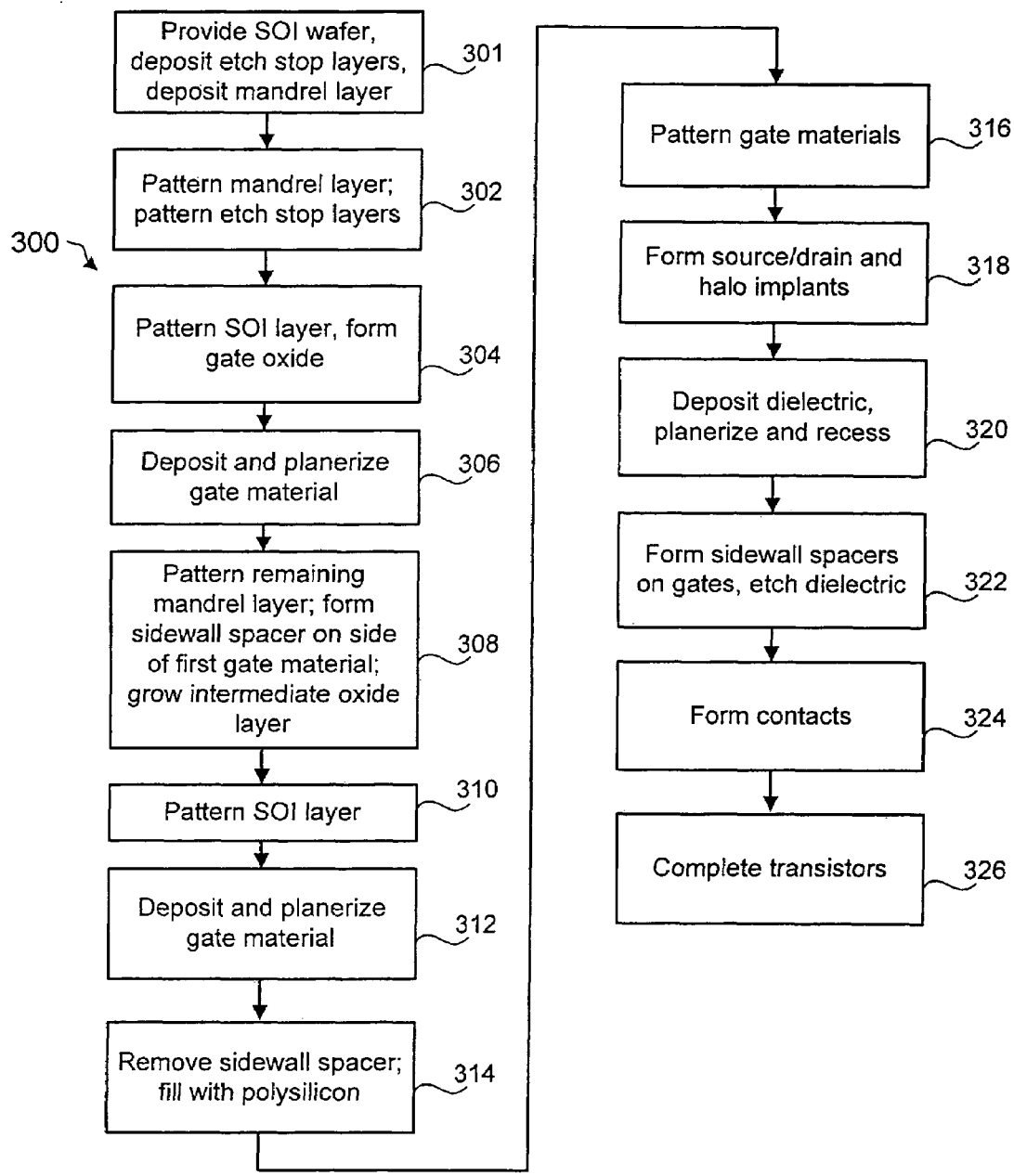
FIG. 16 is a flow diagram illustrating a second fabrication method.
Figure 17:
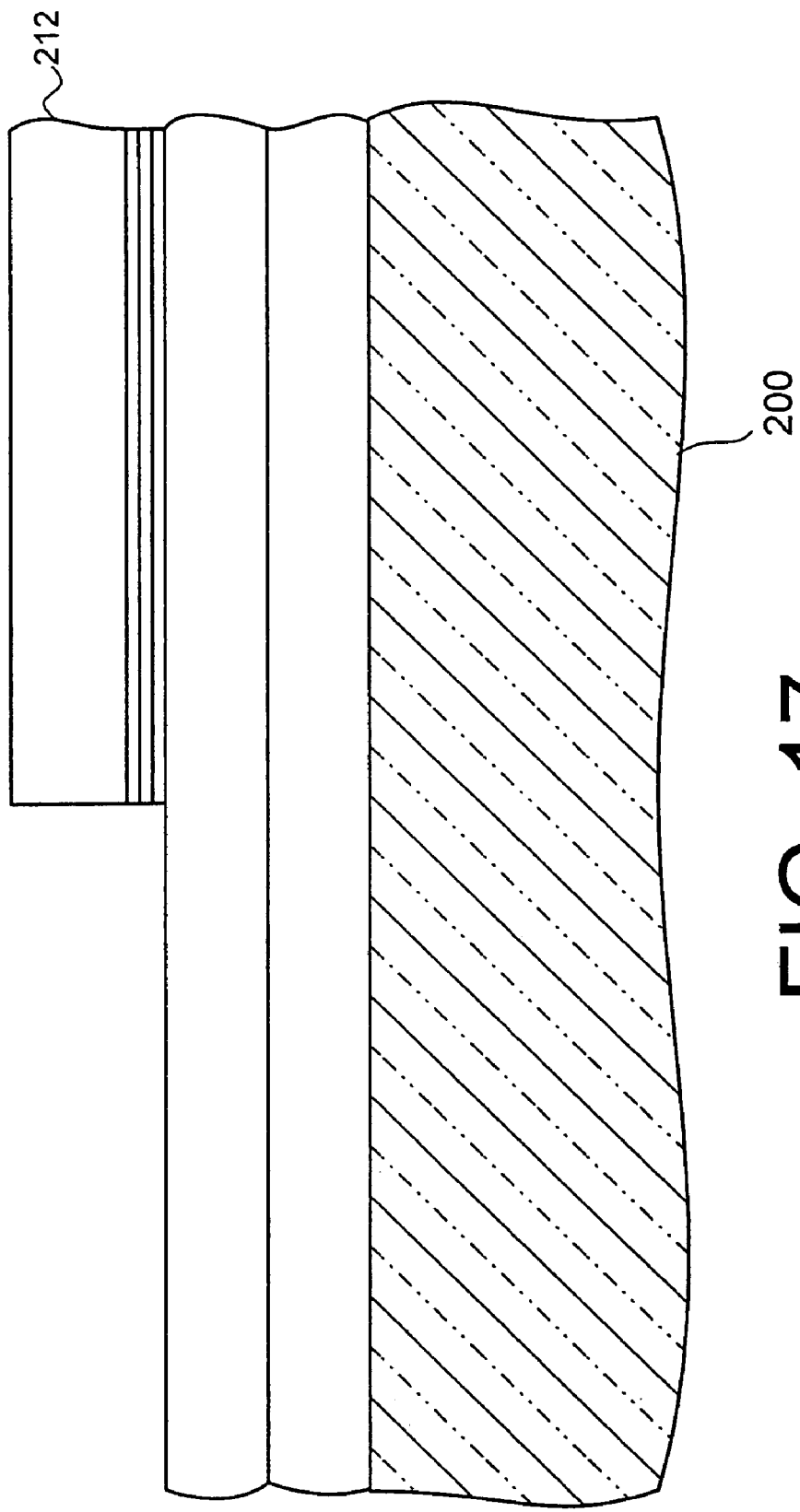
FIGS. 17-24 are cross-sectional side views of a second exemplary double gated transistor during fabrication.

Turning now to FIG. 16, a alternative preferred embodiment method 300 is illustrated. This method has. the advantage of resulting in minimal erosion of the sidewall spacer used to define the transistor body since the spacer is now exposed to reactive ion etching only once. Consequently the silicon etch profiles achieved with this embodiment are very well controlled. In step 301, the wafer is prepared, etch stop layers and a mandrel layer is formed in as in step 101 of the method 100 described above. Then in step 302, the mandrel layer is patterned and the etch stop layers are directly etched. This differs from method 100 in that no sidewall spacer is formed on the mandrel layer before the etch stop layers are patterned. Turning to FIG. 17, the wafer portion 200 is illustrated after the formation of the etch stop layers, the mandrel layer, and the etching of the mandrel layer and etch stop layers directly.

The next step 304 is to pattern the SOI layer using the remaining mandrel layer as a mask, and to form gate oxide on the exposed side of the SOI layer. This is preferably done using a suitable reactive ion etch, followed by a thermal oxidation, typically at between 750° C. and 800° C., or by CVD deposition of a high-k material such as aluminum oxide. Also, during this step, an implantation into the body of the transistor can be done. This would preferably comprise an angled implant into the exposed sidewall of the SOI layer, done before the formation of the gate oxide. This implant serves to properly dope the body of the transistor. As will be described in greater detail below, this implant can be performed in a way that achieves uniform concentration density to help compensate for threshold voltage variations that would otherwise result from variations in body thickness.

Figure 18:
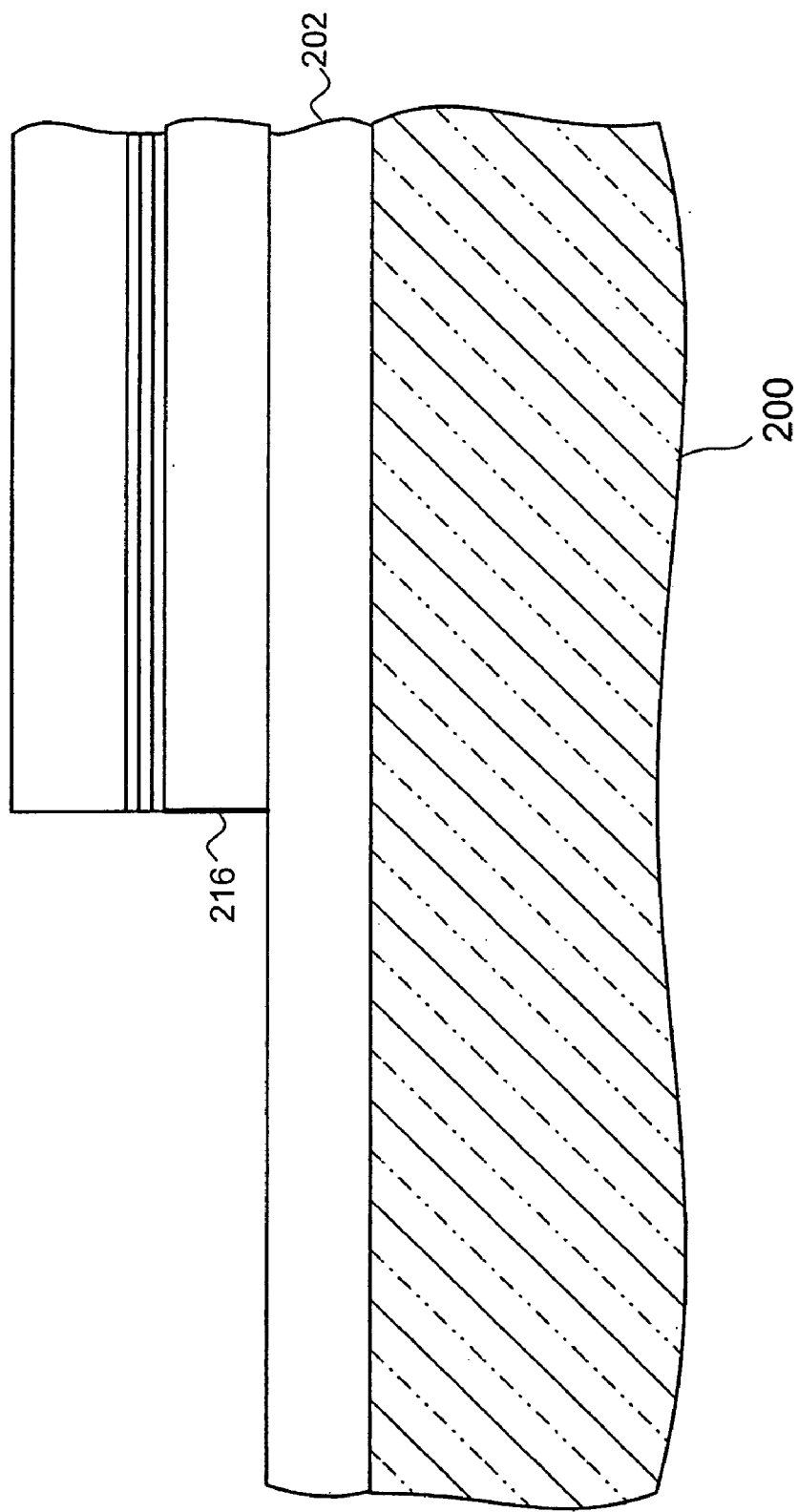

Turning now to FIG. 18, the wafer portion 200 is illustrated after the SOI layer 202 has been patterned and gate oxide 216 has been formed on the side of the SOI layer 202. Again, an angled body implant can also be performed before the formation of the gate oxide.

Figure 19:
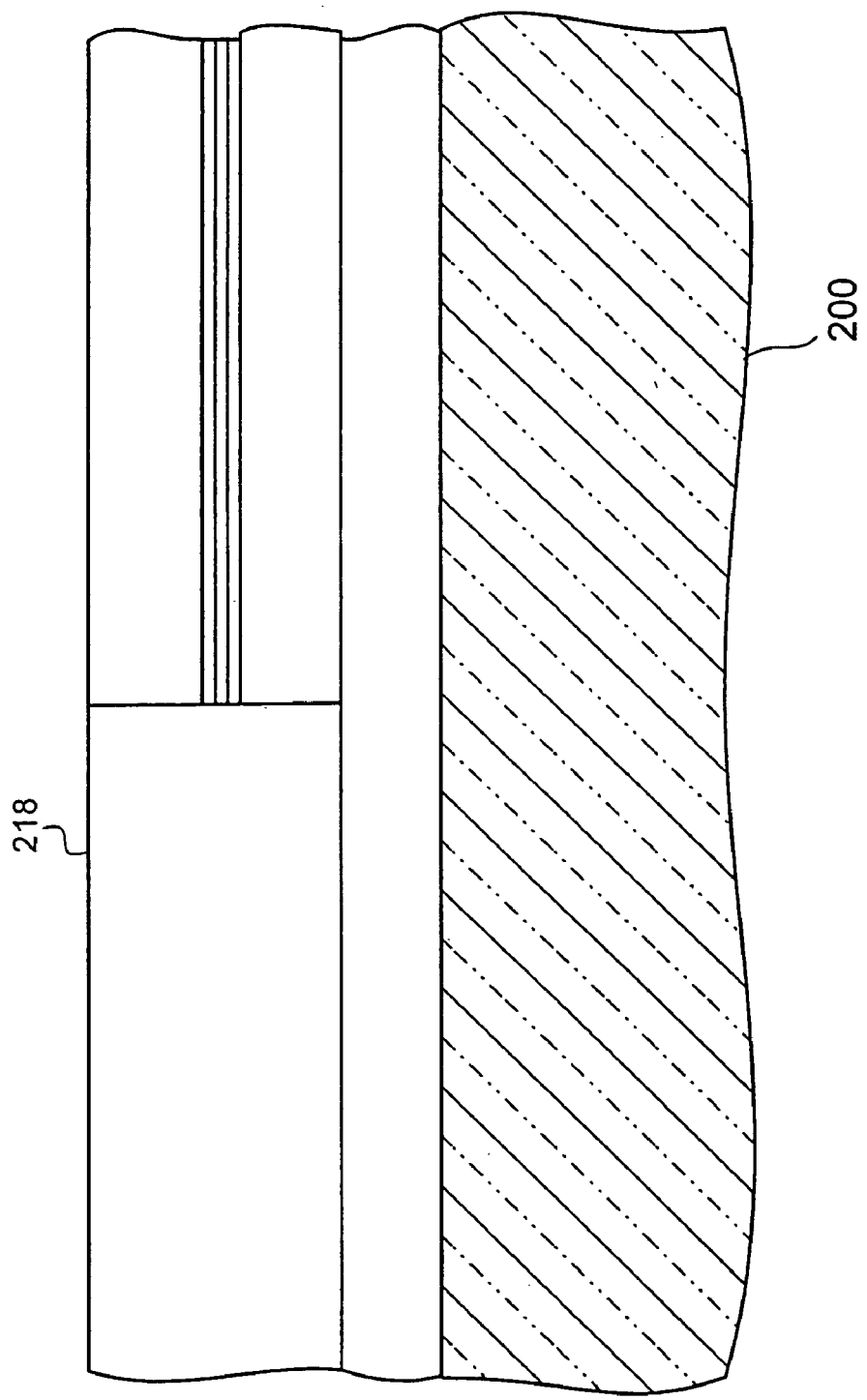

Returning to FIG. 16, the next step 306 is to deposit and planerize the gate material. As described above, in the preferred embodiment, the double gated transistor has one gate formed n+ and the other gate formed p+. In the illustrated embodiment, the gate n+ gate is formed first. Turning to FIG. 19, the wafer portion 200 is illustrated after n+ polysilicon 218 has been deposited and planarized. As will become clear, n+ polysilicon will be used to form one of the gates in the preferred embodiment double gated transistor.

Figure 20:
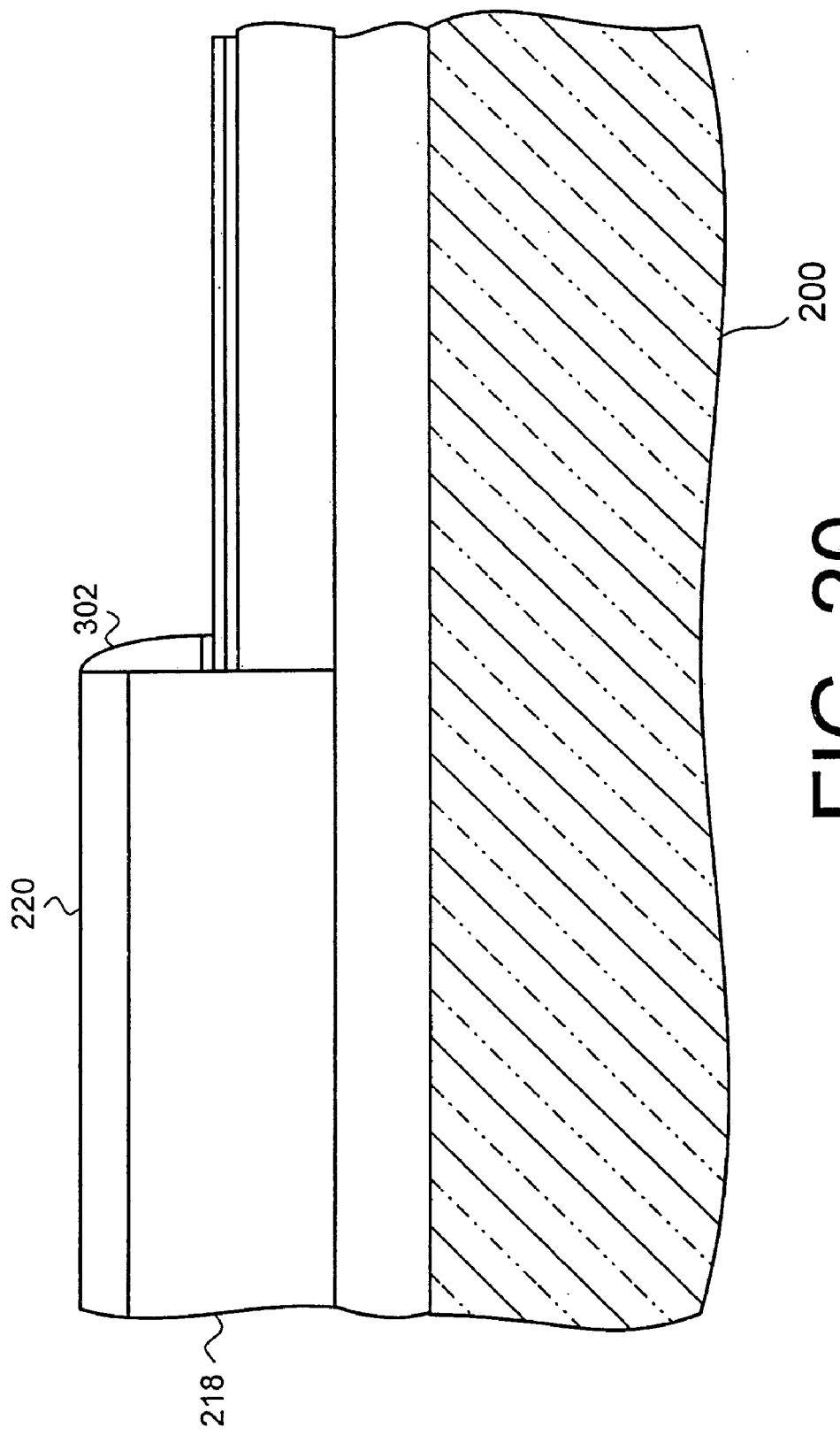

The next step 308 is to remove the remaining mandrel material, form a sidewall spacer along the edge of the remaining first gate material, and form an intermediate oxide layer on the polysilicon gate material. The intermediate oxide layer is formed by growing thermal oxide on the polysilicon gate. Turning now to FIG. 20, the wafer portion 200 is illustrated after the mandrel layer 212 has been removed, the sidewall spacer 302 formed on the sidewall of the first gate material, and a thermal oxide layer 220 has been form on the gate polysilicon 218. The nitride layer 208 that was beneath the remaining mandrel layer is etched selectively to the oxide 220 followed by a brief HF etch which removes the remaining oxide layer 206 which was beneath the remaining mandrel layer.

The next step 310 is to etch the exposed SOI layer. This is preferably done by using a reactive ion etch that etches the SOI layer, stopping on the buried oxide layer. This completes the patterning of the SOI layer to define the thickness of the body of the double gated transistor. Gate oxide is then formed on the exposed side of the transistor body. Again, during this step a implantation into the body of the transistor can be performed. This would again preferably comprise an angled implant into the exposed sidewall of the SOI layer, done before the formation of the gate oxide.

Figure 21:
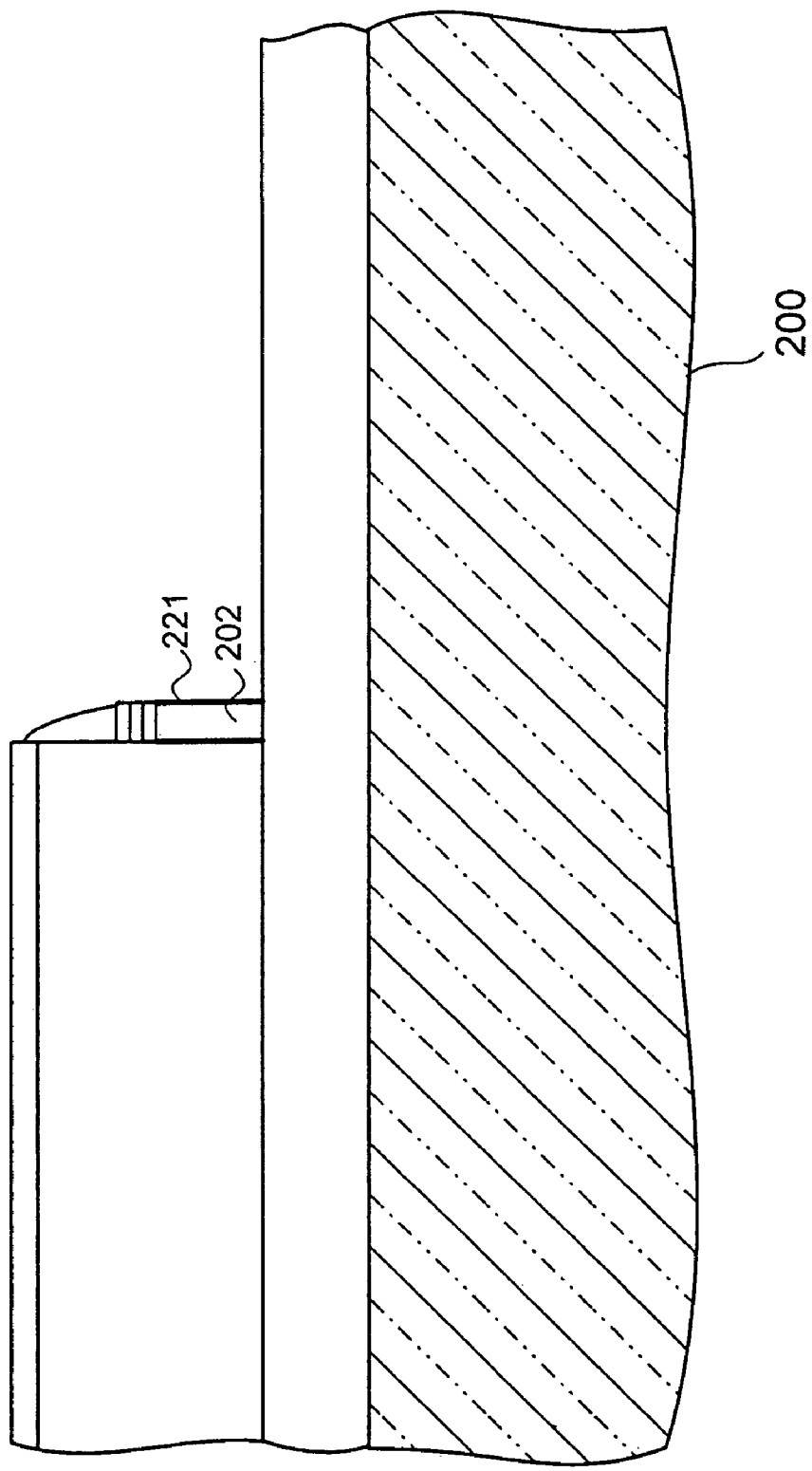

Turning now to FIG. 21, the wafer portion 200 is illustrated after the patterning of the SOI layer 202. The remaining portion of the SOI layer 202 comprises the body of the doubled gated transistor. Gate oxide 221, is formed on the exposed SOI layer 202 using a thermal oxidation or by depositing a dielectric film.

Figure 22:
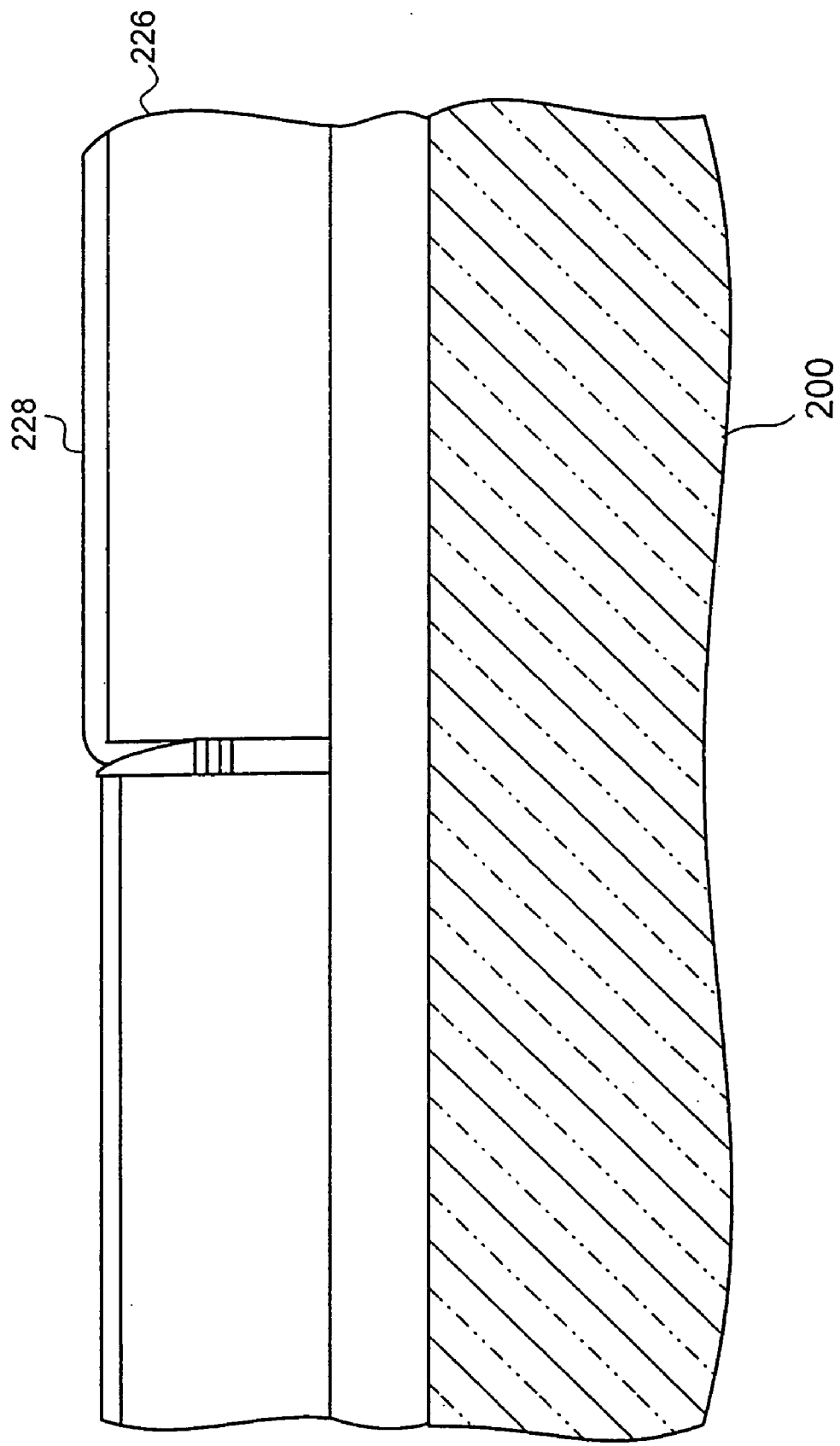

The next step 312 is to deposit and planerize the gate material for the second gate. As discussed above, the preferred embodiment uses gate material of opposite doping to form the two gates. Thus, the preferred embodiment uses p+ doped polysilicon to form the second of the two gates. The planarization of the p+ polysilicon gate material stops on the thermally grown oxide previously formed on the n+ polysilicon gate. After the planarization of the p+ polysilicon, a second layer of thermally grown oxide is formed. Turning now to FIG. 22, the wafer portion 202 is illustrated after the deposition and planarization of p+ doped polysilicon 226 to form the second gate. Thermally grown oxide 228 is then formed on the deposited polysilicon 226.

Figure 23:
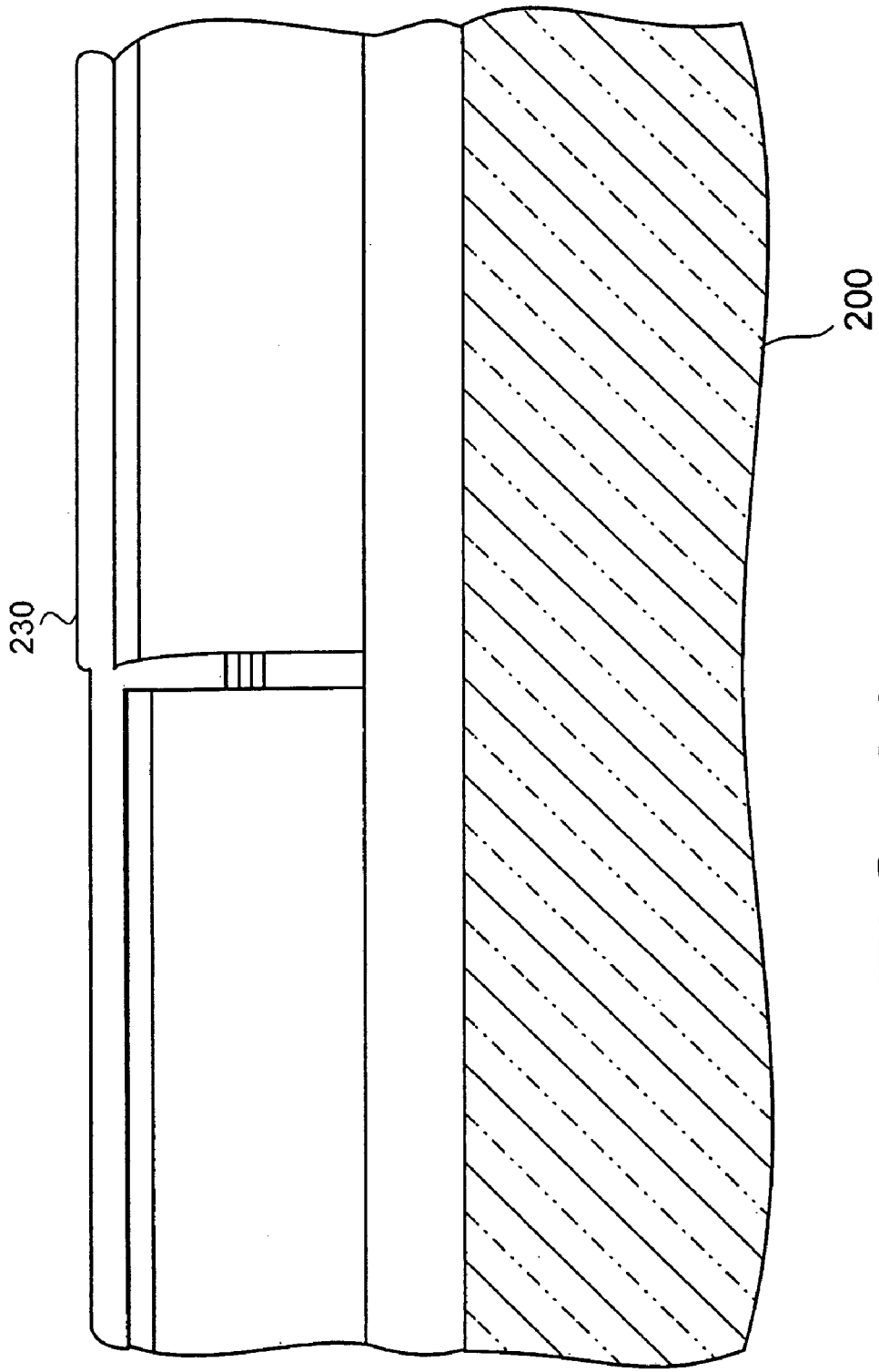
Figure 24:
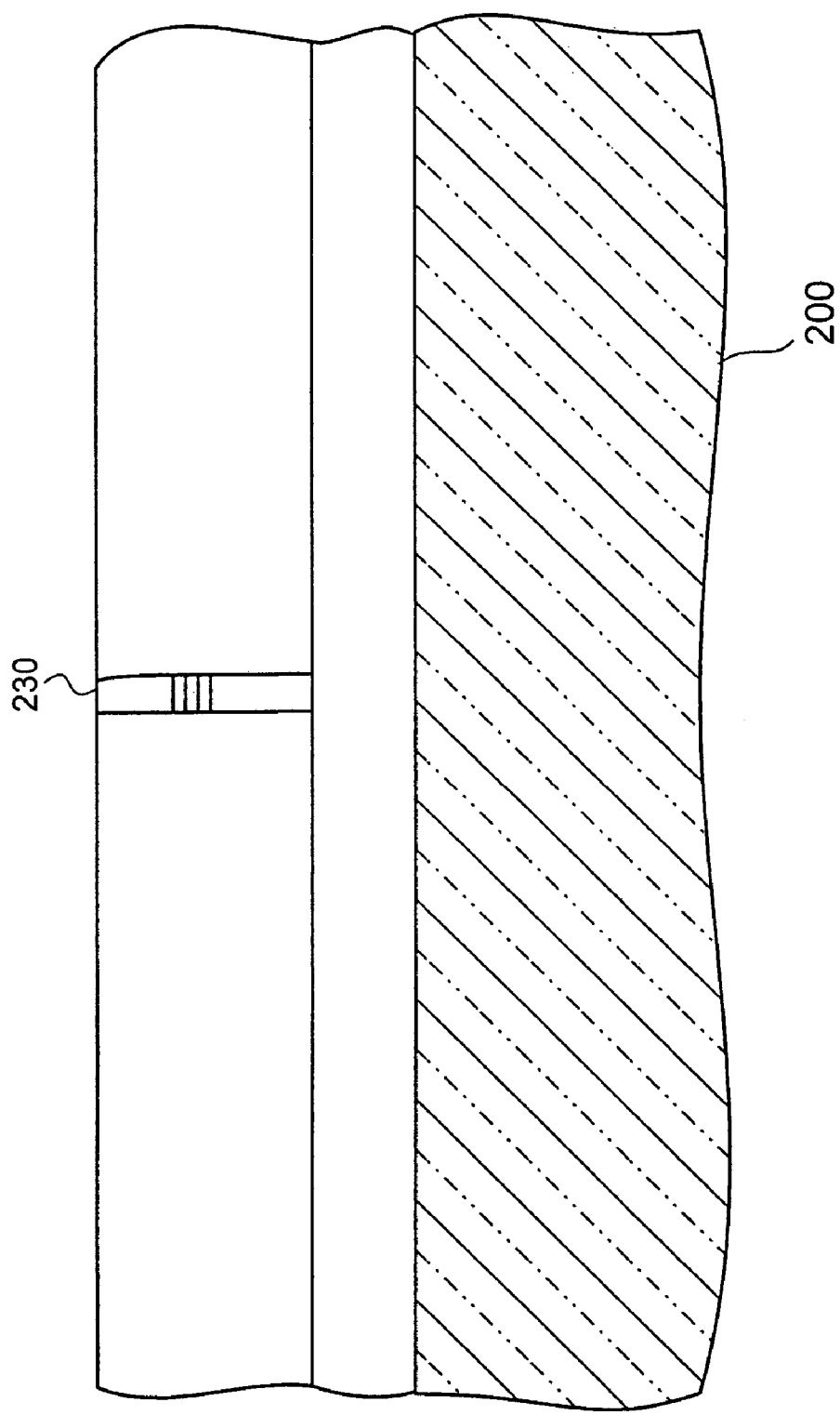

The next step 314 is to remove the sidewall spacer, and fill the sidewall spacer opening with intrinsic polysilicon, to maximize silicide formation in this region later on in the process. Optionally, the sidewall spacer may be left in place if the separate, independent gate contacts are desirable. The intrinsic polysilicon is then planarized using a CMP process that stops on the two layers of thermally grown oxide. This planarization process does not require high selectivity because there is very little excess intrinsic polysilicon to remove. The exposed thermally grown oxide on the two gates is then removed using a similar planarization process. Again, high selectivity is not required for this processing step. Turning now to FIG. 23, the wafer portion 200 is illustrated after the remaining portion of the sidewall spacer 302 has been removed, and then the space is filled with intrinsic polysilicon 230. FIG. 24 then illustrates the wafer portion 200 after the excess polysilicon 230 and thermally grown oxide 220 and 228 have been removed by CMP process. This leaves only a small portion of the intrinsic polysilicon 230 in the place of the originally formed sidewall spacer. This portion of intrinsic polysilicon 230 will be used to allow the formation of a silicide bridge connecting the p+ and n+ polysilicon gates later in the process flow.

Returning to method 300, the remaining steps 316 to 326 are identical to steps 116 to 126 described in method 100. Again, method 300 has the advantage of resulting in minimal erosion of the sidewall spacer used to define the transistor body since the spacer is now exposed to reactive ion etching only once. Consequently the silicon etch profiles achieved with this embodiment are very well controlled.

In an additional embodiment of the present invention, steps are taken to compensate for threshold voltage variations that would normally arise due to variations in body thickness. In particular, the threshold voltage is at least partially dependent upon the thickness of the body. As described above, the thickness of the body is mostly determined by the thickness of the sidewall spacer used to define the body during sidewall image transfer. Generally, the process for forming sidewall spacers can result in some variation in the thickness of the sidewall spacer. As such, there can be some variation in the threshold voltage of the resulting device. In many cases, this threshold voltage variation will be within tolerable limits. However, in some cases it may be desirable to compensate for these variations.

Figure 25:
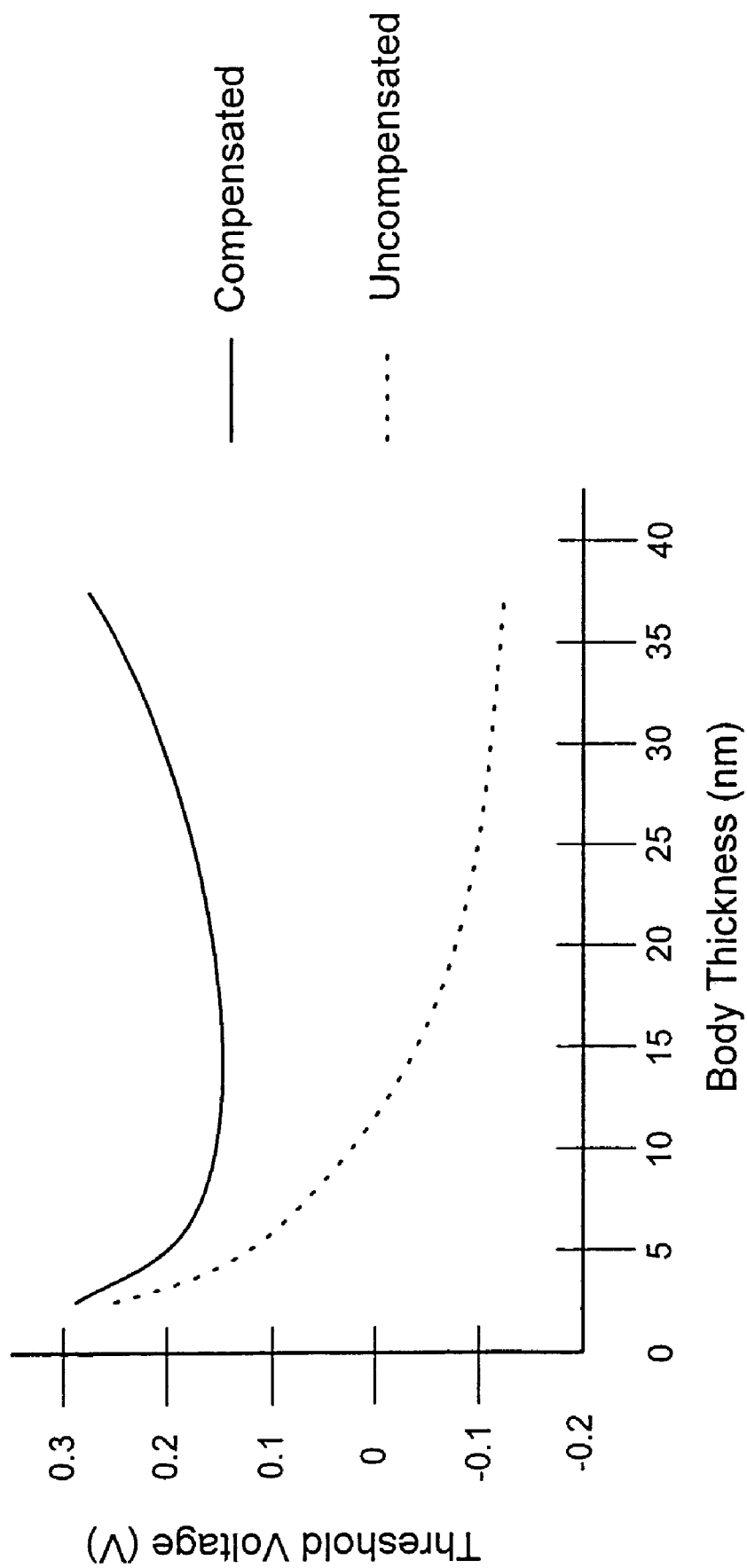
FIG. 25 is a graph of threshold voltage versus body thickness.

In this embodiment, a uniform doping of the body is performed to compensate for the thickness differences. It is generally desirable in this embodiment to make the doping uniform in the three dimension sense, as opposed to a doping scheme that results in uniform dopant amounts, with densities that vary with body thickness. This is done by making an implant that results in a constant, uniform dopant concentration density in the body. Preferably this is done by making several angled implants into the body when the side of the body is exposed. For example, an implant can be made when one side is exposed (as illustrated in FIG. 4) and second implant made when the other side is (as illustrated in FIG. 7) For, example, a uniform fin doping can be achieved by implanting the exposed sidewalls of silicon in FIG. 4 just prior to gate oxidation with an ion implant tilted 45° with respect to the wafer surface and thus inclined 40° to the vertical fin. A series of energies would be used with varying dose in a manner which combines to make a uniform distribution of dopant atoms through the extent of the fin (as shown in FIG. 25) where boron energies of 0.6 keV, 1.2 keV, 2.4 keV and 9.6 keV was implanted into a silicon sidewall with respective doses of 2.1, 4.4, 9.3, 19.5 and $40.8 \times 10^{12}$ atoms/cm$^2$, respectively.

In another method, this uniform concentration is made by performing a perpendicular implant prior to the formation of the etch stop layers and the mandrel layers. When such an implant is made, followed by an extensive anneal, substantially uniform doping concentration is achieved. Additionally, multiple perpendicular implants can be used to achieve this uniformity.

In all these embodiments, pFETs and nFETs would need to be separately masked and implanted, with phosphorus or arsenic used for pFETs and boron for nFETs.

Since the threshold voltage (Vt) for an asymmetric double gate FET with body doping $N_A$ is given approximately by:

$$Vt = \frac{Toxs + \lambda}{Toxs + Toxw - \frac{T_{si} \cdot \varepsilon_{ox}}{\varepsilon_{si}}} \cdot Eg + \phi_{ms} + \frac{Toxs \cdot Q_e}{\varepsilon_{ox}} \cdot \frac{N_A \cdot T_{si}}{2} \quad \text{Eq. 1}$$

where $\varepsilon_{si}$ is the permittivity of silicon, Eg is the band-gap energy of silicon ($\approx$1.1 eV), Tsi is the body thickness, $\lambda$ is the depth of the charge centroid of the inversion layer in the silicon body beneath the surface adjacent to the strong gate ($\approx$1 mm), $Q_e$ is the charge of the electron, $N_A$ is the doping density of the body (or fin), $\phi$ms is the fermi level of the gate electrode relative to that of the inversion layer, when formed, and $\varepsilon_{ox}$ is the permittivity of the gate dielectric, Toxs is the thickness of the insulator with the gate electrode of the fermi level more attractive to the inversion channel carriers (the n+ electrode in an nFET, the p+ electrode in a pFET) and Toxw is the insulator thickness of the insulator with the gate electrode of the fermi level less attractive to the inversion channel carriers (the p+ electrode for an nFET and the n+ electrode of a pFET). It can be mathematically shown from this equation that a choice of doping, $N_A$ given differentiating the equation with respect to $N_A$ solving for the condition that this derivative vanishes gives Vt which is relatively insensitive to doping. Explicitly, when the body doping $N_A$, is chosen to be approximately as in equation 2:

$$N_A = \frac{2\varepsilon_{ox} Eg}{Toxs} \cdot \frac{(Toxs + \lambda)}{\left[(Toxs) + Toxw + Tsi \cdot \frac{\varepsilon_{ox}}{\varepsilon_{si}}\right]^2} \quad \text{Eq. 2}$$

then Vt will be relatively insensitive to variations in the silicon body thickness.

By performing several angled implants into the body, performing several perpendicular implants, or using extensive annealing, a more uniform dopant concentration density is achieved. Having a uniform density regardless of body thickness results in different total doping for different thicknesses. For example, when a uniform doping concentration is created, a thicker body has greater total doping than a thinner body. This change in doping quantity compensates for the different body thicknesses, and results in less threshold voltage variation that would normally occur as a result of body thickness variation. Turning to FIG. 25, a graph is illustrating the threshold voltage ($V_T$) plotted against body thickness ($T_{SI}$) for a regular, uncompensated double gated transistor and a for a double gated transistor that has been compensated for threshold voltage variations by providing a more uniform doping concentration.

As illustrated, the threshold voltage of a double gated transistor where the body has been doped uniformly exhibits less variation as a function of body thickness. Thus, the uniform concentration density doping of the body helps compensate for body thickness variations that would normally greatly affect the threshold voltage.

Thus, the present invention provides a double gated transistor and a method for forming the same that results in improved device performance and density. The preferred embodiment of the present invention uses provides a double gated transistor with asymmetric gate doping, where one of the double gates is doped degenerately n-type and the other degenerately p-type. By doping one of the gates n-type, and the other p-type, the threshold voltage of the resulting device is improved. In particular, by asymmetrically doping the two gates, the resulting transistor can, with adequate doping of the body, have a threshold voltage in a range that enables low-voltage CMOS operation.

While the invention has been particularly shown and described with reference to an exemplary embodiment using a fin type double gated field effect transistor, those skilled in the art will recognize that the preferred embodiment can be applied to other types of double gated transistors, and that changes in implementation details may be made therein without departing from the spirit and scope of the invention. For example, it will also be understood by those skilled in the art that the invention is applicable to different isolation technologies (e.g., LOCOS, recessed oxide (ROX), etc.), well and substrate technologies, dopant types, energies and species. It will also be understood that the spirit of the invention is applicable to other semiconductor technologies (e.g., BiCMOS, bipolar, silicon on insulator (SOI), silicon germanium (SiGe).

The invention claimed is:

1. A method for forming a transistor, the method comprising the steps of:
a) providing a semiconductor substrate;
b) patterning the semiconductor substrate to provide a first body edge;
c) providing a first gate structure of a first fermi level adjacent said first body edge;
d) patterning the semiconductor substrate to provide a second body edge, the first and second body edges of the semiconductor substrate defining a transistor body; and
e) providing a second gate structure of a second fermi level adjacent said second body edge, wherein the step of forming a substantially uniform dopant concentration density in the transistor body comprising forming a dopant concentration between 0.3 $N_A$ and 3 $N_A$, where $N_A$ is defined as:

$$N_A = \frac{2\varepsilon_{ox}Eg}{Toxs} \cdot \frac{(Toxs + \lambda)}{\left[(Toxs) + Toxw + Tsi \cdot \frac{\varepsilon_{ox}}{\varepsilon_{si}}\right]^2}$$

wherein $\in_{ox}$=permittivity of the gate dielectric, wherein $E_{Si}$=permittivity silicon, wherein $T_{OXS}$=insulator thickness with the gate electrode of the fermi level more attractive to the inversion channel carriers, wherein $T_{OXW}$=insulator thickness with the gate electrode of the fermi level less attractive to the inversion channel carriers, wherein $T_{si}$=transistor body thickness, wherein $\lambda$=depth of the charge centroid of a inversion layer in a silicon body beneath the surface adjacent to a strong gate, and wherein $E_g$=bandgap energy of silicon.

2. The method of claim 1, wherein the step of forming a substantially uniform dopant concentration density throughout the transistor body comprises performing a first angled implant when the first body edge is exposed, and performing a second angled implant when the second body edge is exposed, wherein the first and second angled implants are not performed simultaneously.

3. The method of claim 2, wherein the first angled implant comprises an implant at approximately 45° with respect to the semiconductor substrate, and wherein the second angled implant comprises an implant at approximately 45° with respect to the semiconductor substrate.

* * * * *